United States Patent

Mavis et al.

[11] Patent Number: 6,127,864
[45] Date of Patent: Oct. 3, 2000

[54] TEMPORALLY REDUNDANT LATCH FOR PREVENTING SINGLE EVENT DISRUPTIONS IN SEQUENTIAL INTEGRATED CIRCUITS

[75] Inventors: David G. Mavis; Paul H. Eaton, both of Albuquerque, N. Mex.

[73] Assignee: Mission Research Corporation, Albuqueque, N. Mex.

[21] Appl. No.: 09/136,872

[22] Filed: Aug. 19, 1998

[51] Int. Cl.[7] ........................................ H03K 5/13
[52] U.S. Cl. ........................ 327/144; 327/145; 327/295
[58] Field of Search .................. 327/141, 144, 327/145, 202, 213, 295, 296

[56] References Cited

U.S. PATENT DOCUMENTS

| | | | |
|---|---|---|---|
| 5,004,933 | 4/1991 | Widener | 327/141 |
| 5,056,120 | 10/1991 | Taniguchi et al. | 375/371 |
| 5,150,364 | 9/1992 | Negus | 370/542 |
| 5,886,552 | 3/1999 | Chai et al. | 327/165 |

OTHER PUBLICATIONS

Dodd, P.E. et al., "Critical Charge Concepts for CMOS SRAMs", IEEE Transactions on Nuclear Science, vol. 42, No. 6, Dec. 1995, pp. 1764–1771.

Buchner et al., "Comparison of Error Rates in Combinational and Sequential Logic", IEEE Transactions on Nuclear Science, vol. 44, No. 6, Dec. 1997, pp. 2209–2216.

Calin et al., "Upset Hardended Memory Design for Submicron CMOS Technology", IEEE Transactions on Nuclear Science, vol. 43, No. 6. Dec. 1996, pp. 2874–2878.

Baze et al., "Attenuation of Single Event Induced Pulses in CMOS Combination Logic", IEEE Transactions on Nuclear Science, vol. 44, No. 6, Dec. 1997, pp. 2217–2223.

Primary Examiner—Tuan T. Lam
Attorney, Agent, or Firm—Lee & Hayes, PLLC

[57] ABSTRACT

A temporally redundant latch for use in integrated circuit (IC) devices redundantly samples data output from logic or other circuitry at multiple time-shifted periods to provide multiple, independent data samples from which a correct data sample can be selected. The latch has three sampling circuits (e.g., D flip-flops or DICE latches) that sample the logic data output at three different and distinct sampling times. The latch also has a sample release circuit coupled to the sampling circuits to select and output a majority of the samples collected by the sampling circuits at a fourth time that again is different and distinct from the three sampling times. The latch affords both spatial parallelism due to the multiple parallel sampling circuits and temporal parallelism resulting from the clocking scheme involving multiple time-spaced clock signals. The temporally redundant latch is immune to upsets that might occur in the latch itself, as well as upsets that occur in the circuitry and upsets that might occur in any clocking and control signals on the IC device.

39 Claims, 13 Drawing Sheets

TEMPORALLY REDUNDANT LATCH FOR PREVENTING SINGLE EVENT DISRUPTIONS IN SEQUENTIAL INTEGRATED CIRCUITS

TECHNICAL FIELD

This invention relates to integrated circuits, and more particularly, to integrated circuits implementing sequential logic circuitry. This invention relates to latch circuitry used to interconnect sequential logic circuitry.

BACKGROUND

As the microelectronics industry has advanced, integrated circuit (IC) designs have experienced dramatic increases in both density and speed. The reason for these increases is largely due to the decreasing feature sizes with which IC devices are manufactured. "Feature size" refers to the minimum gate length of a CMOS transistor.

Single Event Upset Problem

The inventors work in an area of developing IC devices suitable for space-bound technologies, such as satellites, interplanetary probes, or manned space shuttles. Space application presents a whole host of design issues for semiconductor technologies. IC chips are subjected to hostile environments in space that result in total ionizing dose effects primarily due to interactions with trapped electrons and protons as well as single event effects (SEE) caused by interactions with cosmic rays (high energy heavy ions), high energy protons, and high energy neutrons. Of these effects, single event upsets (SEUs) represent the radiation-induced hazard most difficult to avoid in spaceborne microelectronics systems.

Consider the effects concerning energy loss, charge collection, and upset due to a cosmic ray striking a junction in an IC device. When an energetic ion passes through any material, it looses energy through interactions with the material. The energy loss is primarily due to interactions of the ion with the bound electrons in the material, causing an ionization of the material and the formation of a dense track of electron-hole pairs. The rate at which the ion looses energy is historically termed the stopping power (dE/dx). The incremental energy dE is usually measured in units of MeV while the material thickness is usually measured as a mass thickness in units of $mg/cm^2$. The term LET (linear energy transfer) is often used to mean stopping power.

In silicon, 3.6 eV of energy is needed to create a single electron-hole pair. From the density of silicon (2.42 $gm/cm^3$), a one micron thickness converts to a mass thickness of 0.242 $mg/cm^2$. Also one electron charge equals $1.60 \times 10^{-7}$ pico-Coulomb (pC). Therefore, in silicon, the amount of electron-hole pairs dQ along a track of length L for an ionizing particle having a stopping power LET is given by:

$$dQ(pC) = 0.011 \times L(microns) \times LET(Mev\text{-}cm^2/mg)$$

Thus, an ion with an LET of 100 Mev-$cm^2$/mg leaves approximately 1 pC of electron-hole pairs along each micron of its track.

In bulk silicon, the electron-hole pairs are of no consequence since they will eventually recombine. In the presence of electric fields, however, the electron-hole pairs will be quickly separated as they drift in opposite directions in the field and will be quickly collected by whatever voltage sources are responsible for the field. In bulk CMOS ICs, such electric fields are present across every pn junction in the device. Each and every circuit signal node in the IC device is typically isolated from Vdd by one or more such junctions (PMOS transistor drains) and isolated from ground (Vss) by one or more such junctions (NMOS transistor drains).

FIG. 1 illustrates the effect of an ion passing through an NMOS drain junction on an IC chip. FIG. 1 shows a cross-section of a drain junction 20 having an n+ NMOS drain 22 diffused into a p- epitaxial (epi) layer 24 on a p+ substrate 26. The junction 20 isolates a circuit node at positive voltage (+V) relative to the substrate voltage (Vss). The ion passing through the junction 20 produces a dense track 30 of electron-hole pairs, which are represented by the "+" symbol for electrons and the "-" symbol for holes. The electron-hole pairs behave much like a conductive plasma, which perturbs the potential contours forming a funnel region 32.

A prompt component of current is observed at the circuit signal node as the electric field in the junction and funnel regions separate the electron and hole free carriers. For the geometry of FIG. 1, electrons are collected by the circuit node and holes are collected by the substrate node resulting in a negative current pulse on the NMOS diffusion node which tends to discharge the signal voltage. This prompt current pulse is short-lived, lasting on the order of only 100 to 200 picoseconds.

A delayed current component is produced by diffusion of the electrons and holes from regions where the electric field is zero. These charges may, if they do not recombine, eventually reach a field region where they are collected. This delayed component may last as long as several hundred nanoseconds.

Little charge is collected from the p+ substrate region since the recombination rate is high due to the high doping concentration. If the signal voltage on an NMOS drain is zero, the electric fields will be essentially zero and no appreciable charge collection will occur.

Similar processes occur in the vicinity of PMOS drain diffusions formed in n-wells biased to Vdd. In this case, electric fields are present and charge is collected by the PMOS drain if the signal voltage is at zero volts. The collection depth for this case is less (approximately one-half the well depth) since the well-substrate junction is always reverse biased and will also collect charge.

High energy protons and neutrons are also known to produce similar effects indirectly through nuclear reactions within the silicon. In these cases, a heavy ion recoil reaction byproduct passes through a junction and produces a similar charge collection current pulse. In space, high energy protons primarily originate from the trapped protons in radiation belts and from solar flares. For high-altitude aircraft, both high energy neutrons and protons are encountered as reaction byproducts found in cosmic ray showers formed when an energetic heavy ion from space undergoes a nuclear reaction in the atmosphere.

The prompt current component described above has been responsible for SEUs observed in spaceborne circuits over the last 10–15 years. Most notably, the SEUs are detected in static latches and SRAMs (static random access memories). The effect that the near-instantaneous current has on the circuit depends on the response of the circuit to the charge collected on the signal node. Basically, the capacitance of the signal node determines (to first order) how large a voltage swing dV will result from the collection of a charge dQ according to dV=dQ/C. (This is exact only in the approximation that the circuit is too slow to dissipate the charge in several hundreds of picoseconds.) High drive transistors mitigate this effect since they dissipate the collected charge more quickly. Also, and most importantly for latches and SRAMs, positive gain feedback loops cause a data bit flip once the collected charge reaches a critical value (Qcrit) sufficient to drive a node voltage past the switching voltage. More detailed discussions of these effects, and SRAM circuit response in particular, can be found in Dodd, P. E. and F. W. Sexton, "Critical Charge Concepts for CMOS SRAMs", IEEE Transactions on Nuclear Science, Vol. 42, No. 6, December 1995, pp. 1764–1771.

Feature Size Reduction Heightens SEU Problem

SEUs become more problematic as feature size decreases. Features sizes in non-radiation hardened commercial fabrications have shrunk below 1.0 micron (several years ago) to 0.18 microns (currently) and continue to shrink to a projected 0.05 microns (by the year 2012).

To achieve this reduction, a number of scaling models have been used in the industry, including lateral scaling where only the gate length is scaled, constant voltage scaling where the supply voltage Vdd is kept constant, and constant field scaling where Vdd is decreased as the gate oxide thickness is decreased to maintain a constant electric field in transistors. The constant field scaling model has proven to be the most practical since it avoids several deleterious effects of high fields (gate oxide breakdown and hot electrons).

For constant field scaling, as all physical device dimensions (such as gate length L, gate width W, and gate oxide thickness $T_{ox}$) are reduced, the supply voltage Vdd and the threshold voltage Vth are also reduced proportionately. This results in proportionately lower drain current (I), proportionately lower load capacitance (C), and proportionately lower circuit gate delay (C*Vdd/I). The lower transistor current for constant field scaling also means that metallization current densities (responsible for electromigration) increase less rapidly than for constant voltage scaling for which transistor current remains constant. Also, for low power systems, constant field scaling (in which Vdd scales proportionately) is the only viable alternative since it results in substantially lower (by the square of the scaling) power dissipation.

Spaceborne microelectronics typically lag behind their commercial counterparts by one or two generations because of the more complicated fabrication steps needed to achieve the total-dose hardening requirements of space. Radiation-hardened ICs are presently being fabricated in 0.8 micron to 0.7 micron feature sizes. SEU in static latches and SRAMs became an important issue once feature sizes dropped below 10 microns and the critical charge for upsetting a circuit dropped below 1 pC (roughly corresponding to a particle LET of 50 MeV-cm$^2$/mg and a collection depth of two microns). It has really been the internal feedback loops within the latches that made SEUs important over the last decade for these types of circuits.

Static latch SEU vulnerability has been calculated and measured as a function of technology feature size to establish the relationship between the critical charge needed to upset the circuit and the technology feature size. All results indicate that the critical charge needed to upset a latch decreases as the square of the feature size. If this relation holds as electronics feature sizes decrease from 0.8 micron (present day spaceborne) to 0.18 micron (present day commercial), the critical charge will decrease by nearly a factor of 20.

Experimentally observed LETs for 0.8 micron standard cell latch designs have been as low as 5 MeV–cm$^2$/mg and as high as 20 MeV-cm$^2$/mg. Even with thinner epitaxial layers, 0.18 micron designs could have SEU threshold LETs no higher than 1 MeV-cm$^2$/mg. While the area cross section for a heavy ion hit will be a factor of 20 lower, the integral fluency of cosmic rays above 1 MeV-cm$^2$/mg is 1000 times larger than the fluency above 20 MeV-cm$^2$/mg for a geosynchronous orbit. This implies an SEU error rate (per bit) increase of a factor of 50. Since 0.18 micron designs will likely have 20 times the number of latches on a given die size as 0.8 micron designs, the total IC error rate will be 1000 times larger.

Past Solutions to SEU Problem

Previous solutions to alleviate the SEU problem have focused on SRAM and latch designs. Some of the most interesting work has focused on latches for use in ASIC (application specific integrated circuit) designs, although the results can conceivably be applied to SRAM designs.

One such latch is described in U.S. Pat. No. 5,311,070 to Dooley, J. G., entitled "SEU-Immune Latch for Gate Array, Standard Cell, and other ASIC Applications". This latch design uses a cross-isolation method to ensure that the state of the latch cannot be altered by a heavy ion strike on any single critical node.

Another design is presented in Calin, T., M. Nicolaidis, and R. Velazco, "Upset Hardened Memory Design for Submicron CMOS Technology", IEEE Transactions on Nuclear Science, Vol. 43, No. 6, December 1996, pp. 2874–2878. This design, termed the DICE (dual interlocked storage cell) latch, also cannot be upset with a single node strike.

Each of these latches can, however, be upset if a single cosmic ray traveling through the IC at a shallow angle nearly parallel the surface of the die simultaneously strikes two sensitive junctions. The geometrical cross section for this happening, while small, may still be significant for some spaceborne applications.

Single Event Transient Problem for Sequential Circuits

Apart from inducing SEUs at the gate and substrate level, cosmic rays can also induce single event transients (SETs) in combinatorial logic, in global clock lines, and in global control lines at the circuit level. The SETs have only minor effects in present 0.8 to 0.7 micron technologies since the speed of these circuits is insufficient to propagate the 100 to 200 ps SET any appreciable distance through the circuit. However, as smaller feature size (and thus faster) technologies find their way into spaceborne systems, these transients will be indistinguishable from normal circuit signals.

FIG. 2 shows a log graph plotting the critical transient pulse width needed to propagate an SET without attenuation through an infinitely long chain of inverters as a function of technology feature size. At pulse widths smaller that the critical pulse width, the inherent inertial delay of the gate causes the single event transient to be attenuated. The SET dies out after passing a few gates. At pulse widths equal to or larger than the critical pulse width, the single event transient propagates through the gate just as though it is a normal circuit signal. As a general rule of thumb, SETs of pulse width greater than the critical width propagate through any number of gates without attenuation; SETs of pulse width less than half the critical width terminate in the first gate; and SETs of intermediate pulse width propagate through a varying number of stages.

The curve in FIG. 2 is the result of SPICE simulations performed for various technology feature sizes (shown by the dots on the curve) between 1.2 microns (1200 nm) and 0.13 microns (130 nm). A generic set of SPICE model parameters was developed using known model parameters for technology sizes between 1.2 microns and 0.7 microns, inclusive. The constant field scaling rules were applied to the generic model and to the transistor sizes to predict model parameters at the smaller feature sizes. The scaled values of various critical parameters (Vdd, Vth, and Tox) were consistent throughout with projections published in the National Technology Roadmap for Semiconductors. The solid curve connects the simulation points while the dashed curve extrapolates the points to 0.05 micron (50 nm), the projected feature size of commercial technologies in the year 2012.

As discussed earlier, cosmic ray-induced transients have pulse widths of 100 to 200 picoseconds. FIG. 2 confirms that by the next one or two generations of spaceborne microelectronics systems, which employ ICs with feature sizes below 0.35 microns, SETs will no longer be attenuated within the gates of a circuit, but instead will propagate as normal circuit signals. This will have serious, if not grave, implications for sequential circuits.

FIG. 3 illustrates a conventional circuit topology for a sequential circuit 40. The circuit 40 has a first latch 42, combinatorial logic block 44, and a second latch 46. In this illustration, the latches 42 and 46 are implemented as D flip-flops. The data from the first latch 42 is typically released to the combinatorial logic 44 on a falling clock edge, at which time logic operations are performed. The output of the combinatorial logic 44 reaches the second latch 46 sometime before the next falling clock edge. At the falling clock edge, the second latch 46 stores whatever data happens to be present at its input and meeting the setup and hold times.

If a heavy ion strike occurs within the combinatorial logic block 44 and the logic is fast enough to propagate the induced transient, the SET eventually appears at the input of the second latch 46 where it may be interpreted as a valid signal. Whether or not the SET gets stored as real data depends on the temporal relationship between its arrival time and the falling edge of the clock.

FIG. 4 shows a timing diagram to illustrate the temporal relationship for the case that the true data is low and a positive SET appears erroneously at the input to the second latch 46. FIG. 4 shows a clock signal 50 and four different SET signals 52–58 illustrating four cases at which an SET can arrive in relation to the falling edge of the clock signal 50.

The transient will be incorrectly interpreted as valid data and subsequently stored in the latch if it is high during the time period extending from a setup time before the clock edge and to a hold time after the clock edge. The latch is presumed to be fast enough so that the setup time plus hold time is less than the width of the SET. In FIG. 4, the first SET signal 52 occurs before this interval, and hence is not latched in the second latch 46. The fourth SET signal 58 occurs after this interval, and again does not result in a latched state. However, the second and third SET signals 54 and 56 represent the earliest and latest, respectively, arrival times for a latching condition in which the SET signal is erroneously stored in latch 46.

FIG. 5 shows another timing diagram that illustrates the temporal relationship for another type of SET that can cause invalid data to be stored in the latch. In this case, the SET occurs on the clock line itself. FIG. 5 shows a data signal 60, a normal clock signal 62, and three different clock signals 64–68 that are corrupted by an SET (represented by the dashed line in each case).

The true data 60 satisfies the latch setup and hold times relative to the falling clock edge in order for it to be correctly stored under normal circuit operation as represented by clock signal 62. Clock signal 64 contains a negative SET on the clock line, which causes the falling edge of the clock signal to fall prematurely. As a result, a low value for the data signal 60 is incorrectly stored.

Clock signal 66 shows a positive SET intermediate of the asserted high data signal. The SET in clock signal 66 does not cause any problems since it comes and goes after the high data has been stored and while the data remains high. Clock signal 68 contains a positive SET during the falling edge of the data signal 60. The SET in clock signal 68 causes the latch to store erroneously a low in place of the previously stored high. It is noted that the transient need not be coincident with the falling edge of the data signal to cause a problem. The latch will be corrupted for any clock line transient whose falling edge is later than the data falling edge.

Relation of Clock Frequency to SEUs and SETs

Various error rates in sequential circuits (i.e., latch SEU and combinatorial logic SET) depend on the clock frequency. Upsets can occur in latches only when the clock is low and the latch is in a hold state. Since the clock is always low 50% of the time, latch SEU rates do not depend on the clock frequency. However, SETs produced in the combinatorial logic will be stored if they reach the latch input coincident with clock edges, the number of which depend linearly on the frequency. Accordingly, the SEU rate for latches is independent of clock frequency while the combinatorial logic SET error rate is directly proportional to clock frequency. These error rate relations have been demonstrated experimentally using pulsed laser illumination of test circuits while measuring the various error rates as a function of clock frequency in Buchner, S., M. Baze, D. Brown, D. McMorrow, and J. Melinger, "Comparison of Error Rates in Combinatorial and Sequential Logic", IEEE Transactions on Nuclear Science, Vol. 44, No. 6, December 1997, pp. 2209–2216.

These error rate relations actually compound the SET problem as IC technology feature sizes continue to shrink. Smaller feature sizes result in smaller gate delays that permit circuits to be operated at higher clock frequencies. Not only does each combinatorial gate in a circuit contribute transient errors (because transients are no longer attenuated), but the probability of storing any given error also increases (because of the higher clock frequencies).

To date, efforts in the area of SETs have been limited to characterizing the mechanisms, simulating the propagation process, and developing analytical tools to estimate error rates in future designs. Despite these efforts, there remains a substantial need for techniques to eliminate errors introduced by single event upsets and single event transients.

The inventors have developed circuit techniques to solve the SET problem as well as the conventional static latch SEU problem.

SUMMARY

This invention concerns an integrated circuit (IC) device that implements sequential circuitry that is immune to single event transients (SETs) and single event upsets (SEUs), such as those caused by cosmic rays impacting the IC device.

The sequential circuitry has combinatorial logic, or other circuitry, that outputs data and a latch that samples and holds the data. According to an aspect of this invention, the latch is a temporally redundant latch that is immune to upsets that might occur in the latch itself, as well as upsets that might occur in the combinatorial logic and upsets that might occur in any clocking signals in the sequential circuit. The temporally redundant latch redundantly samples the data from the logic at multiple time-shifted periods to provide multiple, independent data samples from which a correct data sample can be selected.

In one implementation, the temporally redundant latch includes three sampling circuits (e.g., D flip-flops or DICE latches) that sample the logic data at three different and distinct sampling times. A sample release circuit is coupled to the sampling circuits to select and output a majority of the samples collected by the sampling circuits at a fourth time, which is again different and distinct from the three sampling times.

The sampling circuits are triggered by three sampling clock signals and the sample release circuit is triggered by a separate release clock signal. A clock generating circuit derives the four clock signals from a master clock signal carried into the IC device. In one implementation, the four clock signals operate at a frequency that is one-half the frequency of the master clock. Each clock signal has a pulse width that is greater than the duration of an upset, such as greater than 200 ps, so that a single upset may at most corrupt only one of the clock signals.

The temporally redundant latch attains upset immunity as a consequence of two distinct parallelisms: (1) a spatial parallelism resulting from the multiple parallel sampling circuits (e.g., three circuits), and (2) a temporal parallelism resulting from the unique clocking scheme involving multiple time-spaced clock signals. These redundancies prevent SEUs in the latch and SETs in the combinatorial logic and global clock lines.

The clock generating circuit can also be implemented with redundancy. It includes multiple clock generators, each of which produces a set of the four clock signals from the master clock signal that can be used to drive the temporally redundant latch. The clock circuit further includes a majority system to select a majority from the sets of clock signals produced by the multiple generators. In this way, any upset event occurring in the clock generating circuit affects at most one of the clock signals, which is weeded out via the majority voting system.

DETAILED DESCRIPTION

This invention concerns a circuit that eliminates upsets from synchronous circuit designs, such as the upsets induced by cosmic rays. The upsets eliminated by the circuitry include both static latch single event upsets (SEUs) that dominate at present day technology feature sizes as well as upsets resulting from combinatorial logic and control line single event transients (SETs) that will dominate in future technology generations. The circuit is referred to as a "temporally redundant latch". Its intended use is to replace conventional latches in any sequential circuit that provides high, or total, immunity to SEUs.

General IC Circuitry

Figure 1:
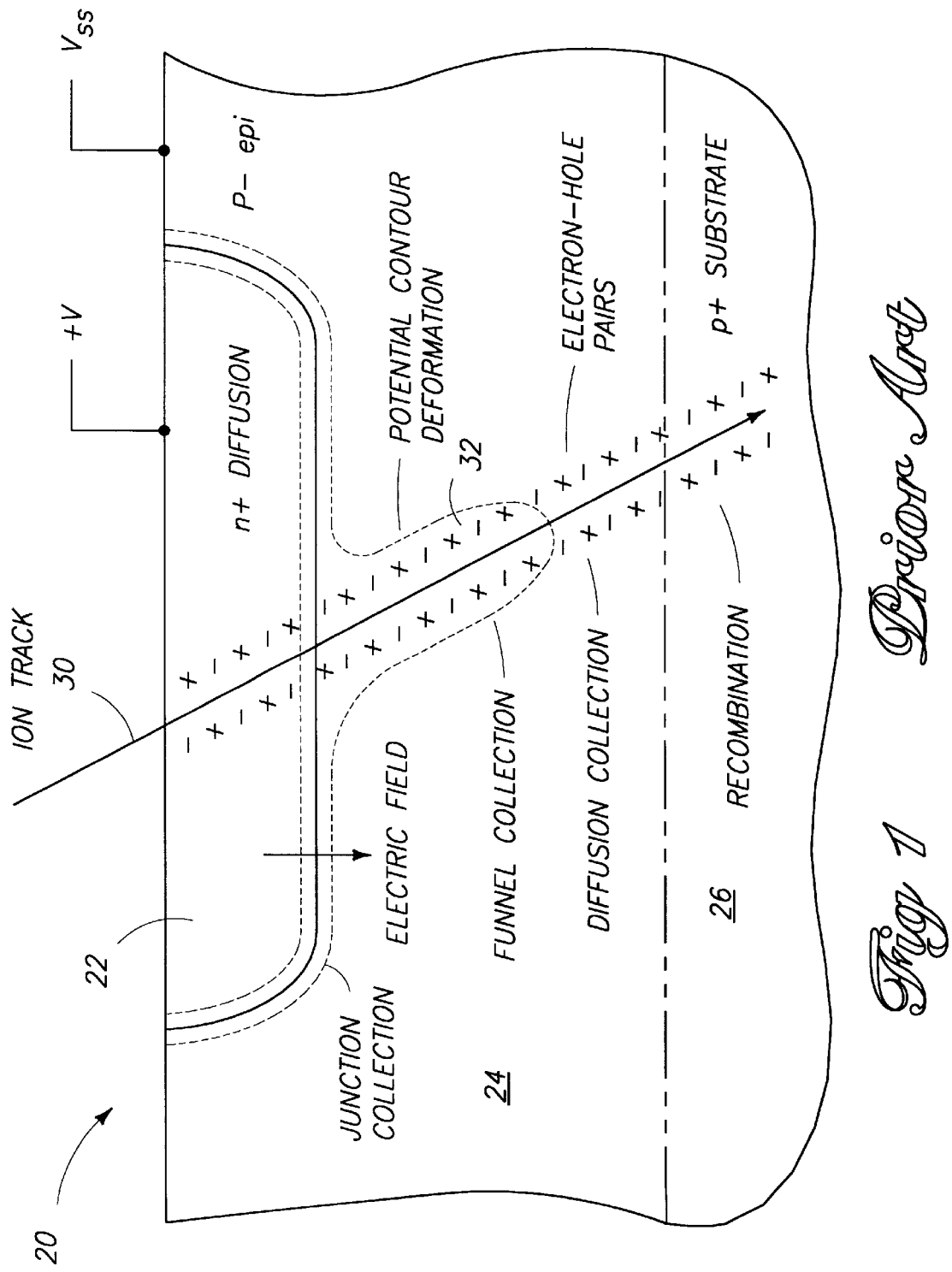
FIG. 1 is a cross-section of a pn junction formed in a silicon substrate.
Figure 2:
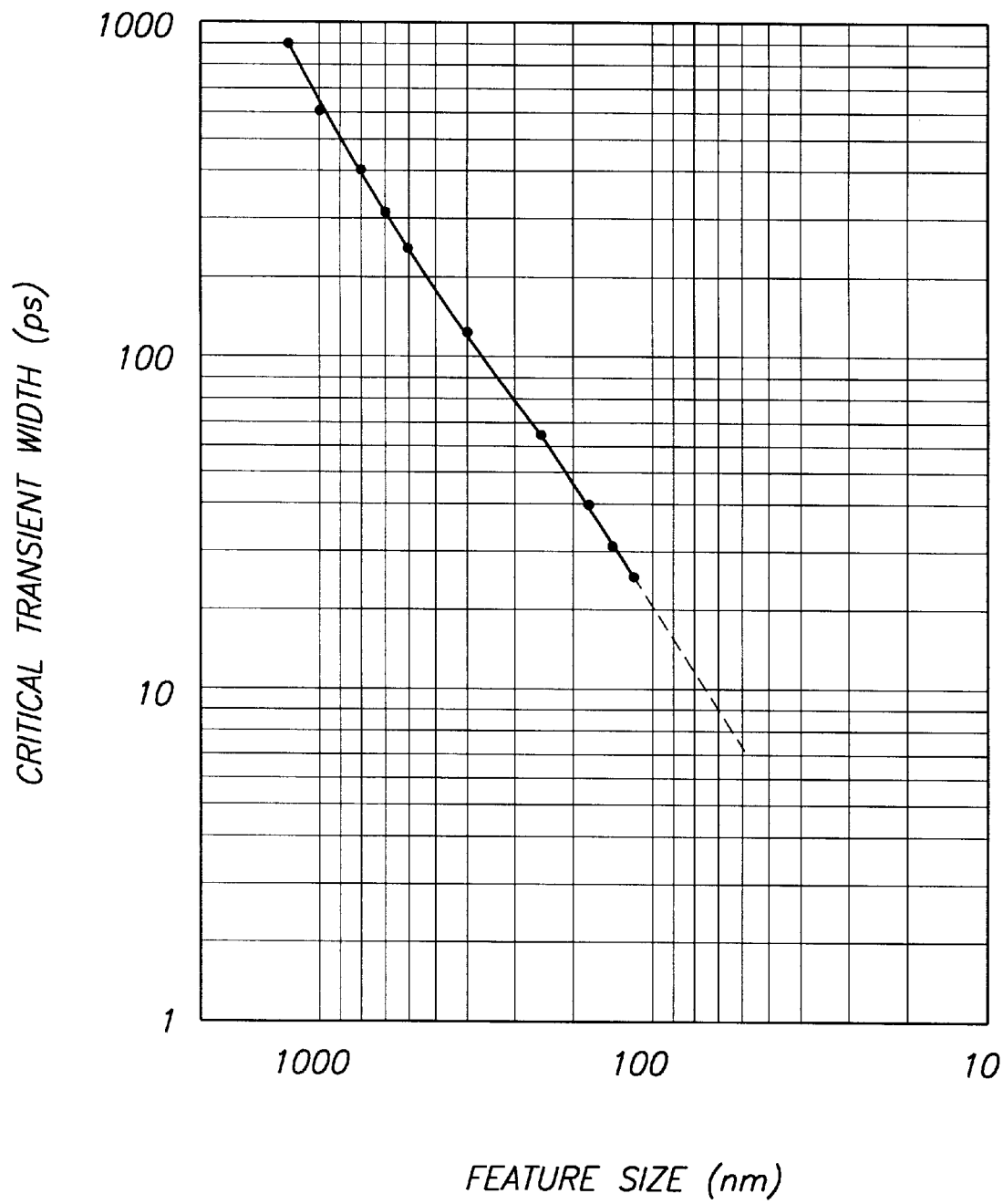
FIG. 2 is a log graph plotting critical transient pulse width needed to propagate an SET without attenuation through an infinitely long chain of inverters as a function of technology feature size.
Figure 3:
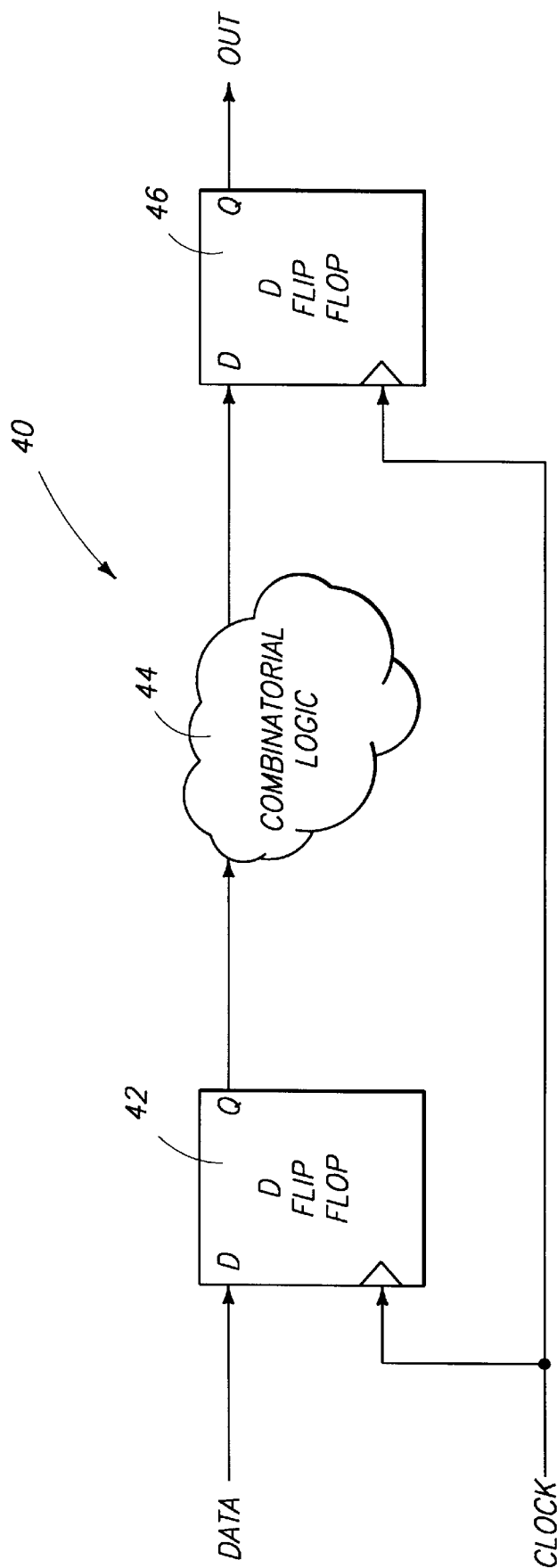
FIG. 3 is a block diagram of a conventional sequential circuit.
Figure 4:
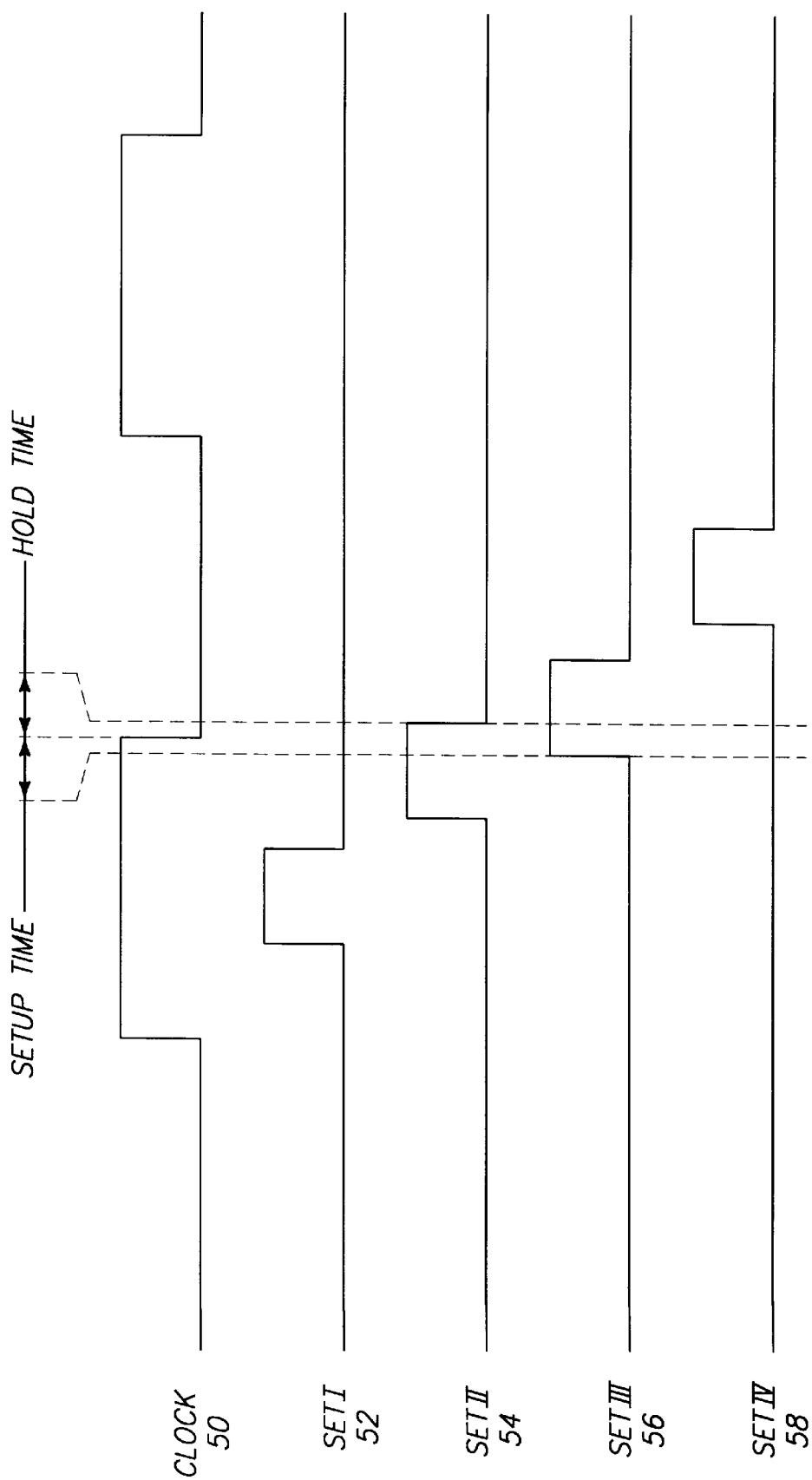
FIG. 4 is a timing diagram illustrating ways in which a SET on a data signal can result in an error.
Figure 5:
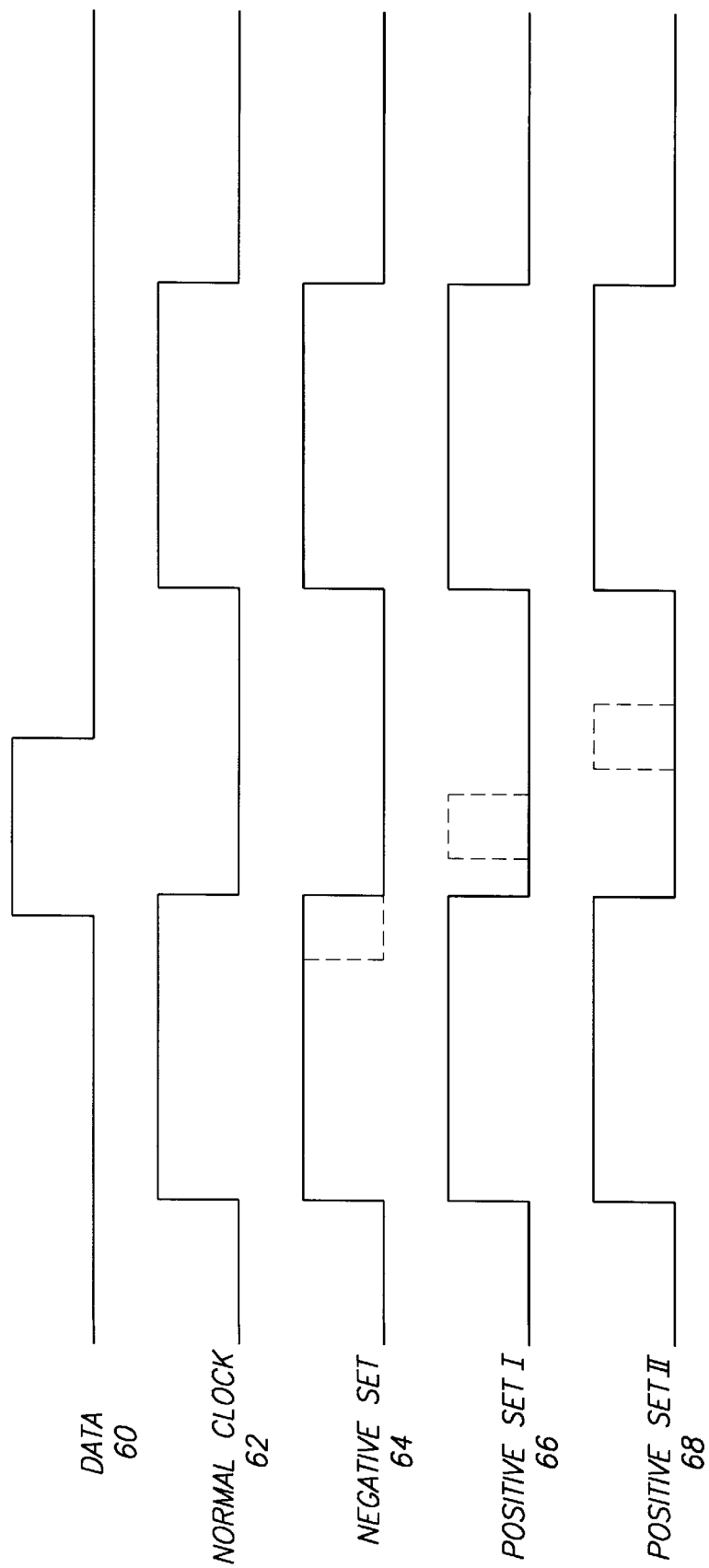
FIG. 5 is a timing diagram illustrating ways in which a SET on a clock signal can result in an error.
Figure 6:
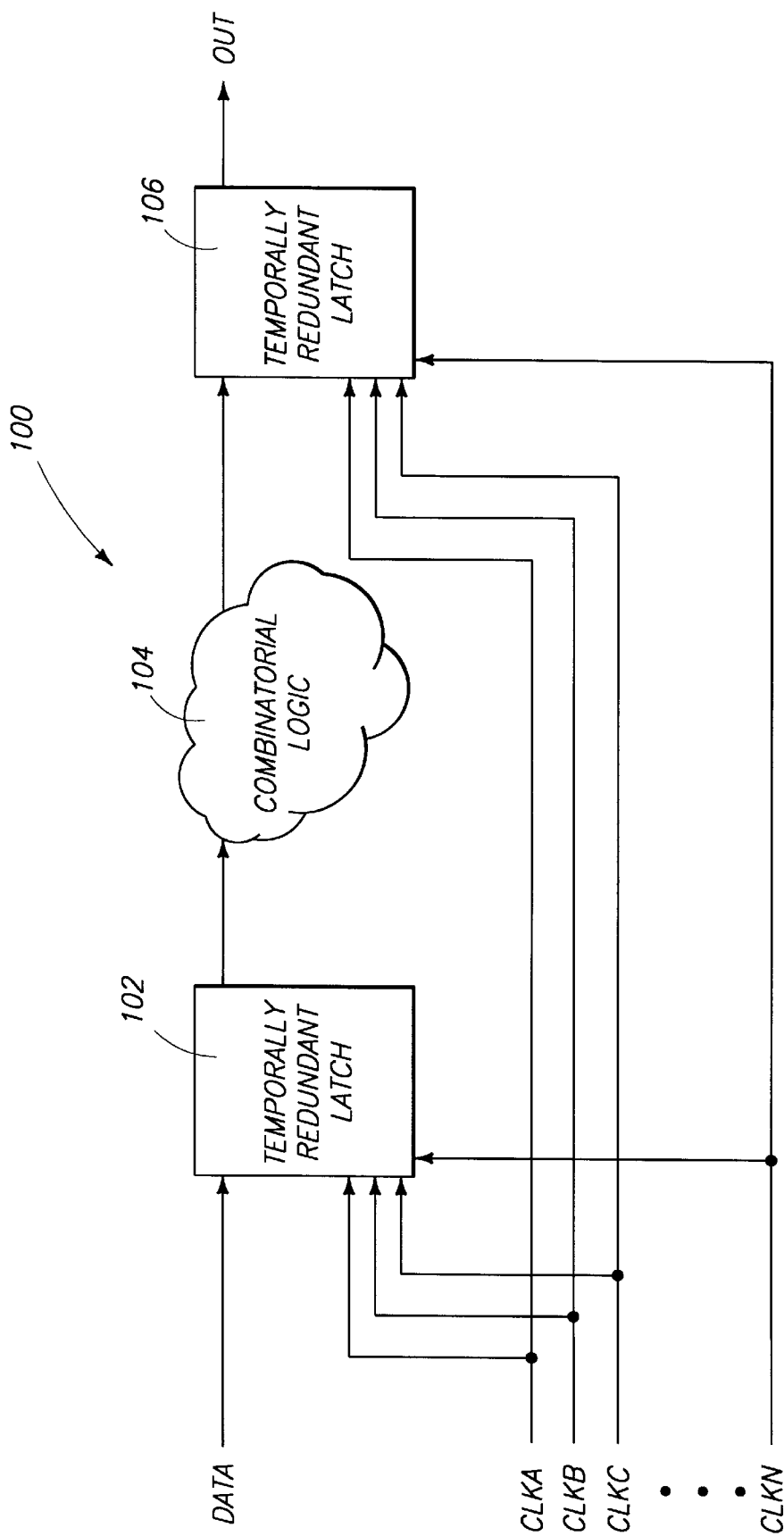
FIG. 6 is a block diagram of a sequential circuit constructed with temporal sampling latches according to an aspect of this invention.

FIG. 6 shows a sequential circuit 100 implemented as an integrated circuit (IC) device. The sequential circuit has a first temporally redundant latch 102, combinatorial logic block 104, and a second temporally redundant latch 106. Data output by the first latch 102 is passed through the combinatorial logic block 104, where the data is manipulated and changed as a result of the logic operations. The data output by the logic block 104 is then latched into the second latch 106.

The latches 102 and 106 are temporally redundant in that each latch takes multiple, time-spaced samples of the same data input at different and distinct "sampling" times as clocked by different clock signals CLKA, CLKB, . . . , CLKN. The latch 102, 106 then votes on the samples at another "voting" or "release" time, which is again different than the "sampling" times. The latch finds the majority of the samples for use as the output data. Through the multiple time-spaced samples, the latch accounts for every possible SET and SEU that might upset the circuit 100 at any time, as is explained below in more detail.

Temporally Redundant Latch

Figure 7:
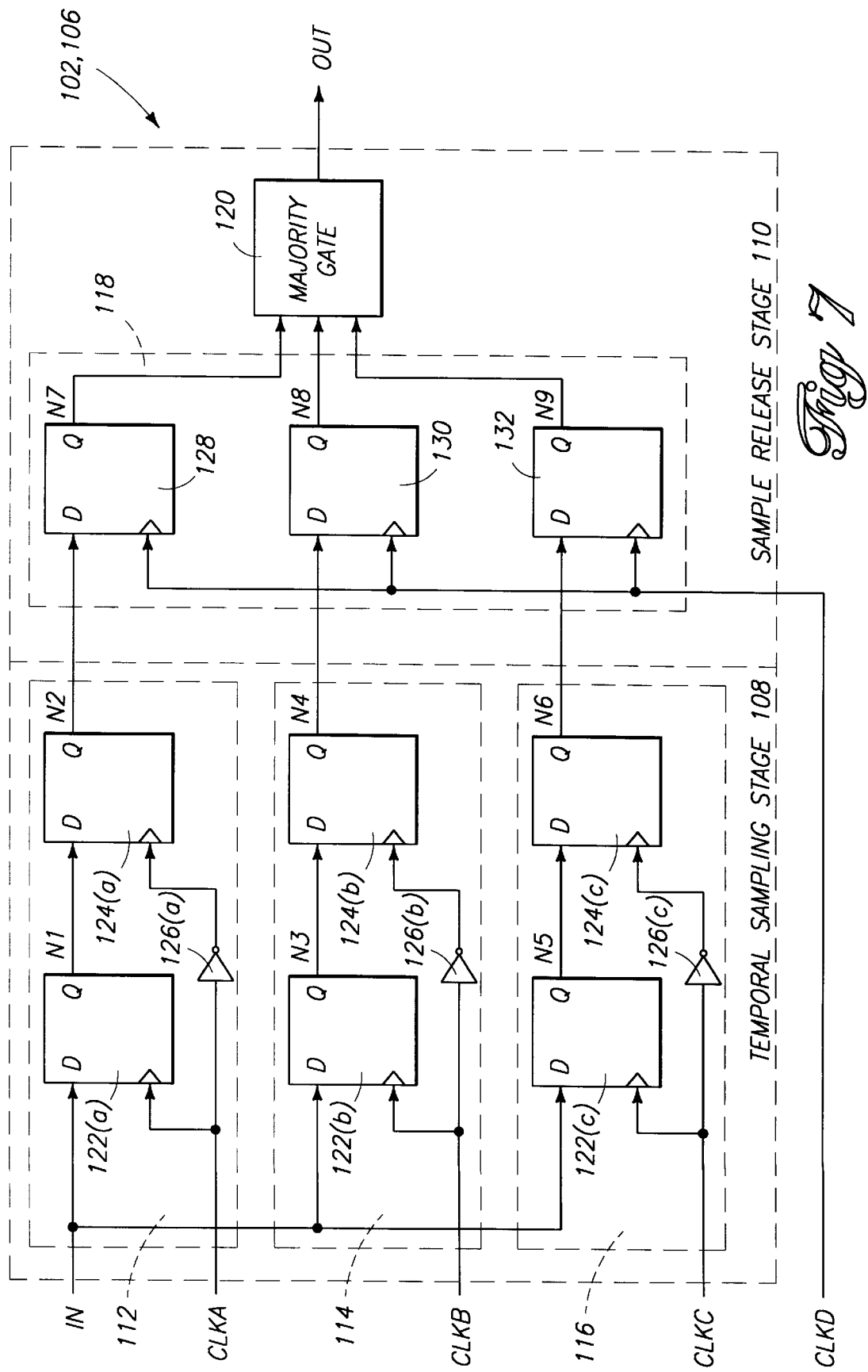
FIG. 7 is a block diagram of a temporally redundant latch employed in the sequential circuit.

FIG. 7 shows the temporally redundant latch 102, 106 in more detail. It contains a temporal sampling stage 108 and a sample release stage 110. The temporal sampling stage 108 contains multiple sampling systems to sample data at input IN at different sampling times. In this example, there are three sampling systems 112–116 operating in parallel. The sample release stage 110 contains a vote timing system 118 to collect the samples at the voting time and a majority system 120 to select a majority of the samples gathered by the vote timing system 118.

Each sampling system 112, 114, and 116 contains an edge triggered D flip-flop, which is formed by two level sensitive latches 122 and 124 arranged in tandem and clocked by complementary clock signals as a result of an inverter 126. Each level sensitive latch 122, 124 is transparent (i.e., sample mode) when its clock input is high and is blocking (i.e., hold mode) when its clock input is low. When in sample mode, data appearing at the input D also appears at the output Q. When in hold mode, the data stored within the latch appears at the output Q and any data changes at the input D are blocked. With the clock inversions, the D flip-flops 112–116 are triggered on the falling edges of corresponding clock signals CLKA, CLKB, and CLKC, respectively. For clarity, the level sensitive latches 122 and 124 are labeled in the format "122(A)" to mean the first latch 122 clocked by the clock signal CLKA.

The complement of each clock is formed locally by the inverters 126. This eliminates the need for routing global complimentary clock signals over the chip. Heavy ion induced transients on the clocks does not affect the SEU immunity of the temporally redundant latch.

The vote timing system 118 contains three level sensitive latches 128, 130, and 132 that are clocked by a fourth clock signal CLKD. The latches 128, 130, and 132 are associated with, and receive data output from, corresponding D flip-flop sampling systems 112, 114, and 116, respectively. The output of latches 128–132 of the vote timing system 118 are connected to the majority system 120, which is implemented as a majority gate. The majority system 120 selects a majority of the samples gathered by the vote timing system 118. That is, the majority system 120 selects the binary value stored by at least two of the three latches 128–132.

The temporally redundant latch 102, 106 is immune to upsets as a consequence of two distinct parallelisms: (1) a spatial parallelism resulting from the multiple parallel sampling systems, and (2) a temporal parallelism resulting from the unique clocking scheme involving multiple time-spaced clock signals. Previous redundant systems have used only spatial parallelism to achieve SEU immunity to cosmic ray strikes in static latches (inherently spatial). Immunity to SETs in combinatorial logic and global clock lines (inherently temporal) cannot be achieved with spatial redundancy alone, but is achieved the by temporal redundancy afforded by the latch 102, 106.

One advantage of this temporally redundant latch is that the entire combinatorial logic 104, which forms the bulk of the sequential circuit, is not replicated multiple times to form a completely spatially redundant circuit. Instead, the combinatorial logic 104 is effectively replicated in time, rather than in space. In the FIG. 6 implementation, the same combinatorial logic 104 is used at three different times. The result is that errors are flushed on each clock cycle and the maximum error latency never exceeds a clock period.

Clocking Scheme

Temporal redundancy in the circuit 100 is achieved by combining a temporal sampling stage 108 with a sample release stage 110 where the sampling is controlled by multiple time-spaced sampling clock signals (i.e., CLKA, CLKB, and CLKC) and the release is invoked by a different voting or release clock signal CLKD.

Figure 8:
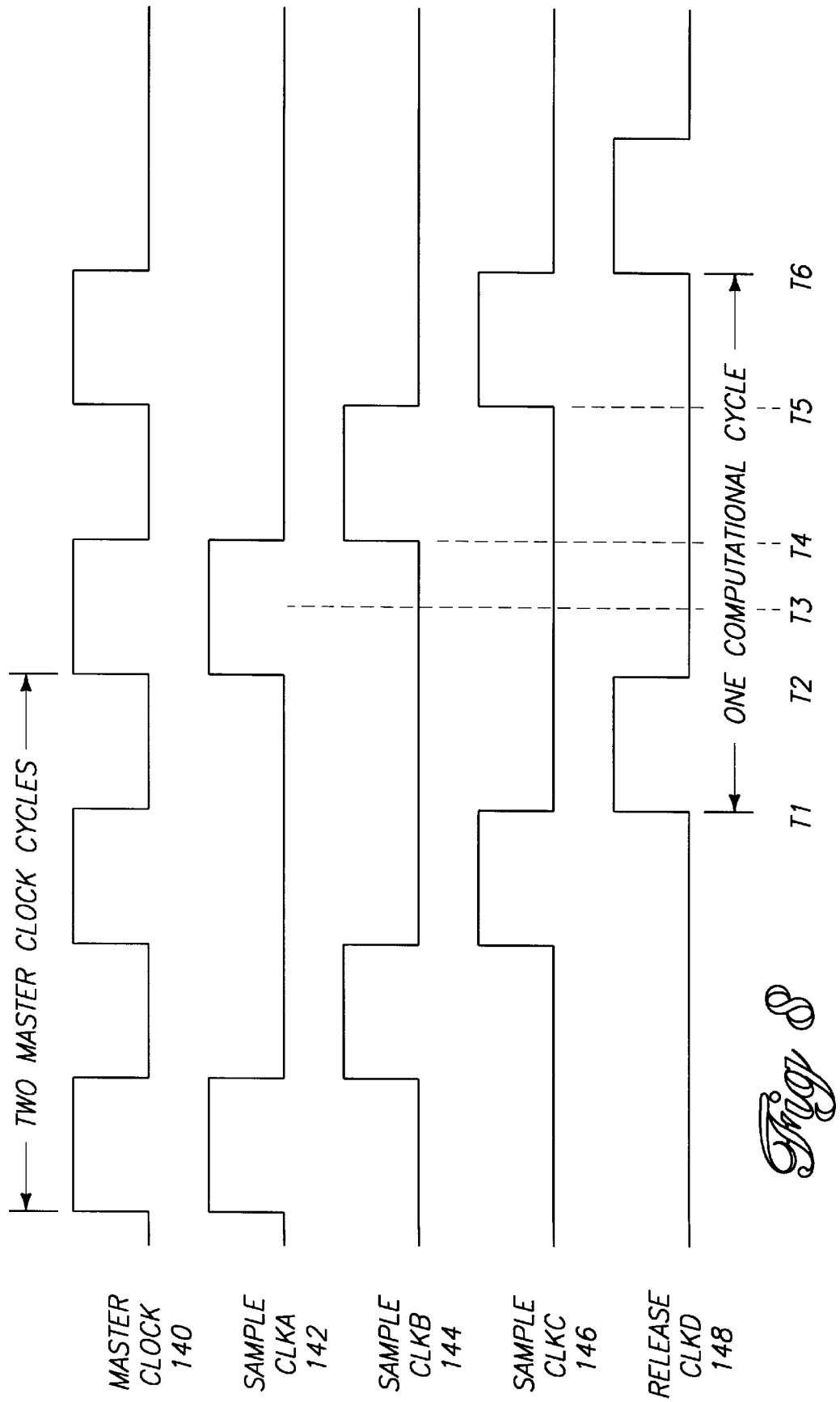
FIG. 8 is a timing diagram of multiple clock signals used to drive the temporally redundant latch of FIG. 7.

FIG. 8 shows the clocking scheme used to drive the sequential circuit 100. In the illustrated embodiment, there is a single master clock signal 140, from which the sampling and release clock signals are derived. Four cycles of the master clock signal 140 are shown. The master clock would generally be the clock signal brought onto the chip through an input pad. It could also be a higher frequency clock generated on chip with a clock multiplier synchronized to the input clock through a phase locked loop.

The three sampling clock signals CLKA 142, CLKB 144, and CLKC 146, as well as the release clock signal CLKD 148, are derived from the master clock signal 140. It is these four signals that are used in the sequential circuit 100.

FIG. 8 shows two cycles of the temporal sampling and release clock signals. Each of the four clocks 142–148 operates at a 25% duty factor and each is in phase with the master clock 140. CLKA is high during the first half of cycle one of the master clock. CLKB is high during the second half of cycle one of the master clock. CLKC and CLKD are high during the first and second halves, respectively, of cycle two of the master clock. Thus, a full cycle of clocks CLKA, CLKB, CLKC, and CLKD occupies two cycles of the master clock. Controlling the fidelity of the four clocks is not a problem because the temporal sampling latch operates correctly even in the presence of skew or overlaps.

In the temporally redundant latch, data is released to the combinatorial logic 104 on the rising edge of sampling clock CLKD and reaches the next latch before the falling edge of sampling clock CLKA (minus the setup time). In FIG. 8, this duration represents the period of the master clock minus the D flip-flop setup time. A conventional circuit that satisfies the timing constraints for the master clock likewise satisfies the timing constraints of this clocking scheme.

The two extra sampling clock signals CLKB and CLKC enables the additional time-spaced sampling. The clock signals occupy one additional master clock period. As a result, the effective on-chip computational frequency is exactly one-half the frequency of the master clock provided from off-chip. Therefore, a factor of two speed penalty is incurred to ensure upset immunity.

It is noted that in other implementations the widths of the extra sampling clock signals CLKB and CLKC can be made smaller. The widths need only be greater than the maximum width of any SET induced in the combinatorial logic 104. As an example, a system might provide a master clock signal that has a frequency of 50 MHz. Clock signals CLKA and CLKD would therefore each have widths of 10 ns. The other two clock signals CLKB and CLKC, however, could each be as narrow as 500 ps (0.5 ns) and still reject the SETs produced in the combinatorial logic. This results in an effective on-chip clock period of 21.0 ns corresponding to a frequency of 47.6 MHz. In this case only a minor speed penalty (4.8%) is incurred by using the temporal sampling latches. If the clock signals CLKB and CLKC are kept at 500 ps as the master clock frequency is increased, the speed penalty approaches its maximum value of two times the master clock frequency.

The clocking scheme of FIG. 8, with equal size clock pulse widths, is more preferred because it is simple to generate and because an effective on-chip frequency exactly one-half the master clock frequency is easier to synchronize to other signals at the board level. Also, if the sampling clocks CLKB and CLKC have widths that are too small compared to the widths of clocks CLKA and CLKD, second order errors, such as multiple strikes in the combinatorial logic, can conceivably occur.

Clock Generation

Figure 9:
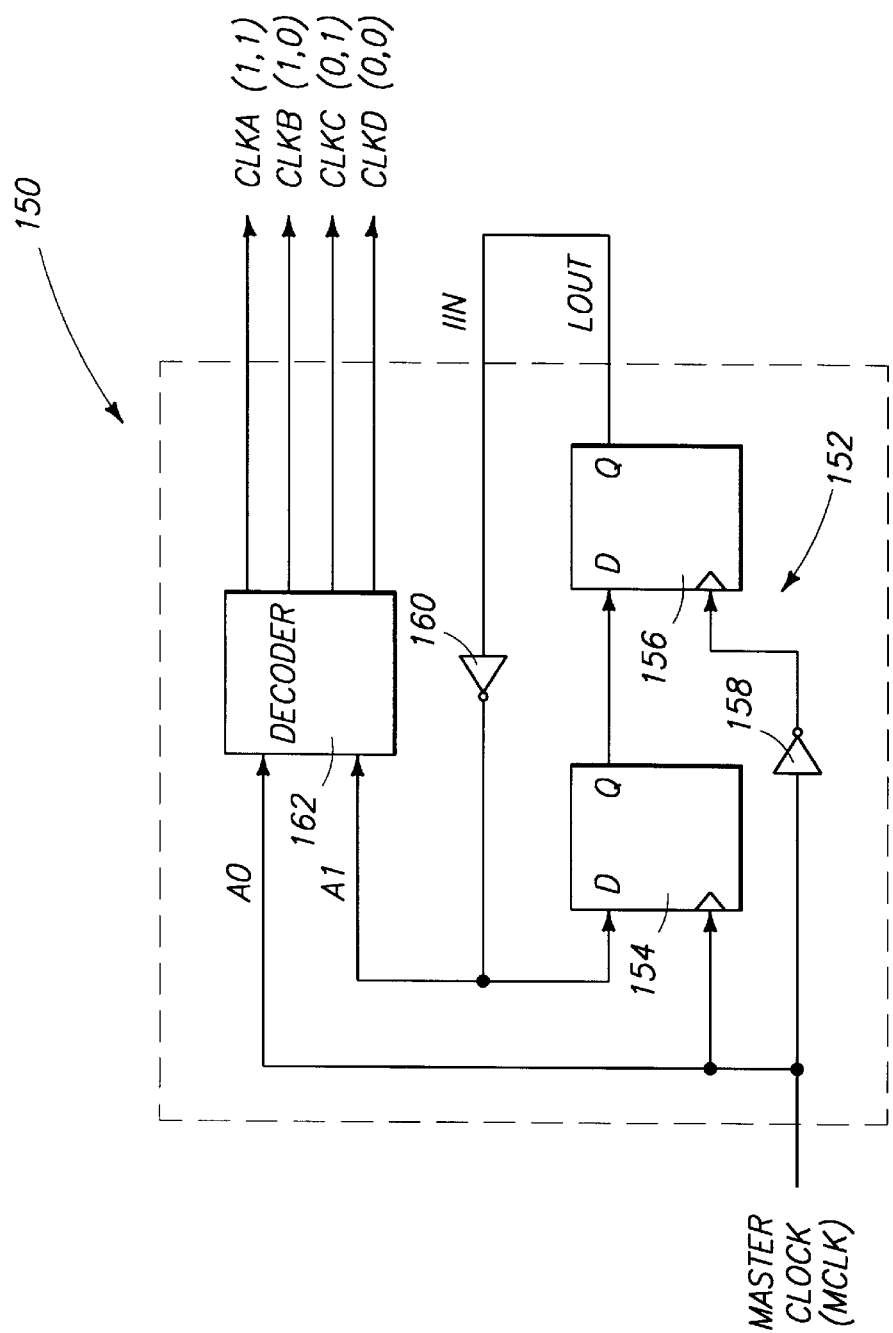
FIG. 9 is a block diagram of a non-redundant clock generating circuit that generates the multiple clock signals.

FIG. 9 shows one embodiment of a clock generating circuit 150 used to generate the four clock signals CLKA, CLKB, CLKC, and CLKD. The master clock (MCLK) is brought on chip through a pad buffer. The clock generating circuit 150 has a D flip-flop 152 formed by level sensitive latches 154 and 156 and an inverter 158. The master clock MCLK is input to the first latch 154 of the D flip-flop 152 and the compliment of the master clock is input to the second latch 156 via the inverter 158.

The output of the latch 156 (LOUT) is fed back to the input of latch 154, via an inverter 160. In this embodiment, the input to the inverter 160 (IIN) is the same as the latch output (LOUT). In another embodiment described below with reference to FIG. 10, this is not the case.

The D flip-flop 152 and feedback inverter 160 perform a divide-by-two operation on the master clock MCLK, generating a new clock signal of one-half the frequency. Latches 154 and 156 are provided with power up reset circuitry (not shown) to initialize the sequence.

The clock generating circuit 150 also includes a decoder 162 that decodes the master and half frequency clock signals into the four clock signals CLKA, CLKB, CLKC, and CLKD. The master clock and the half frequency clock signals form addresses for the decoder 162. Address bit 0 (A0) is taken from the master clock and address bit 1 (A1) is taken from the half frequency clock. The decoder 162 generates a high on only one of the four outputs according the address (A1,A0). As shown in FIG. 9, the decoder toggles the output lines in the following address order (1,1), (1,0), (0,1), and (0,0). These output lines are selected, in this order, to provide the four clock signals CLKA, CLKB, CLKC, and CLKD.

The clock generating circuit 150 is itself susceptible to upsets. In particular, an SEU in one of the level sensitive latches might cause the on-chip control clocks to get out of phase with the master clock. To avoid this upset, another clock generating circuit that is immune to upset may be used.

Figure 10:
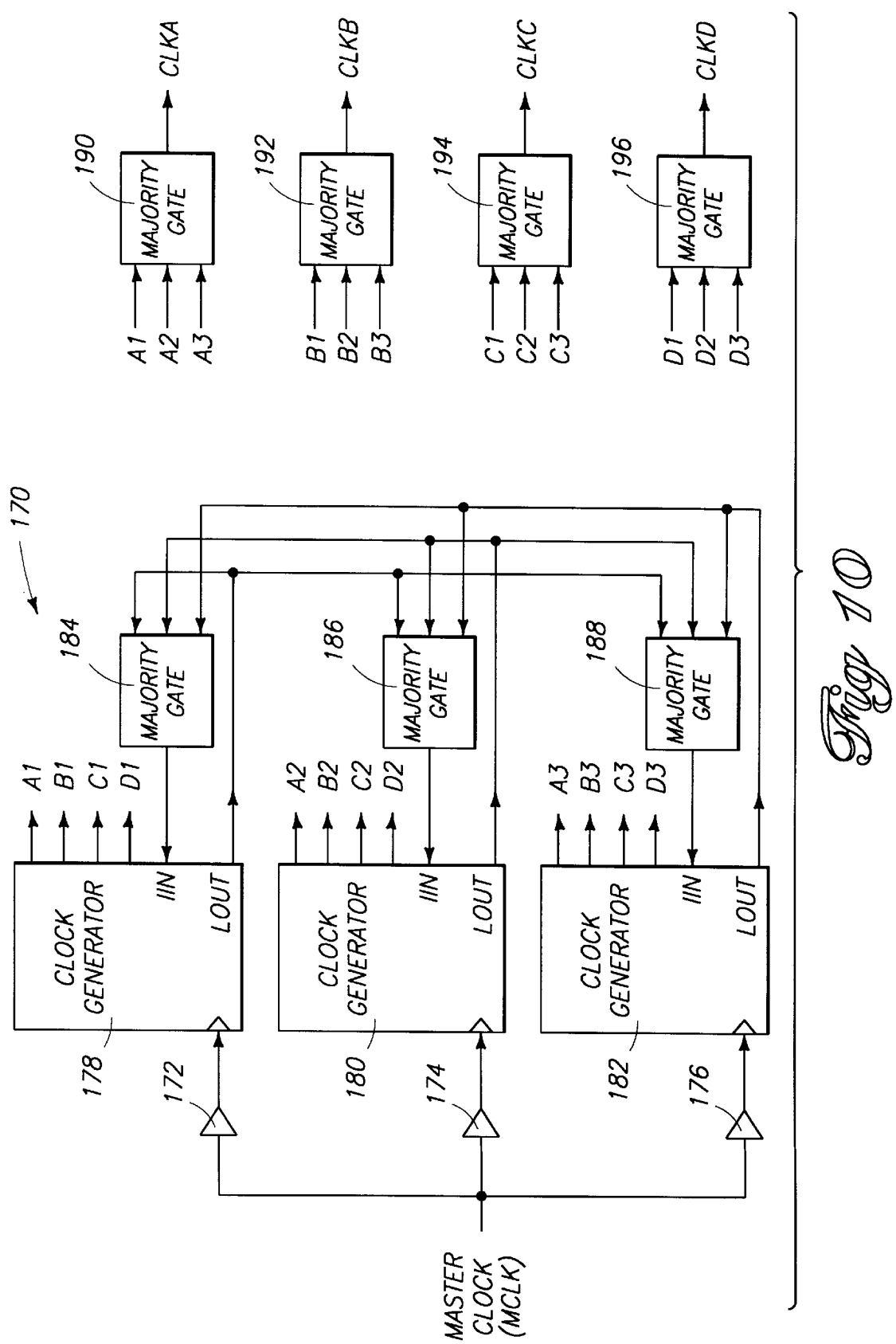
FIG. 10 is a block diagram of a redundant clock generating circuit that generates the multiple clock signals.

FIG. 10 illustrates a second embodiment of a clock generating circuit 170 that is immune to SEUs. The master clock MCLK is brought onto the chip through a pad driver cell that immediately breaks the signal into three independent paths through three independent buffers 172, 174, and 176. In this way, there exists no single node for which a cosmic ray strike can simultaneously affect more than one master clock input of the subsequent generator circuits.

The clock generating circuit 170 has three clock generators 178, 180, and 182 arranged in parallel to receive the three versions of the master clock signal. Each clock generator contains the circuitry 150 shown within the dashed box of FIG. 9. (Note that in FIG. 9 the dashed box breaks the wire connecting the latch output to the inverter input.) In FIG. 10, each of the three latch outputs LOUT are fed to three majority gates 184, 186, and 188 and the majority gate outputs are fed back to the three inverter inputs IIN within the clock generators 178, 180, and 182.

The clock generating circuit 170 also has four additional majority gates 190, 192, 194, and 196 that are coupled to receive outputs A1–A3, B1–B3, C1–C3, and D1–D3 from the clock generators 178–182, respectively. The four majority gates 190–196 generate the final clocks CLKA, CLKB, CLKC, and CLKD from the three generator outputs.

With this arrangement, each of the three parallel clock generators 178–182 provides a full complement of on-chip control clocks. The resulting circuit can no longer get out of phase with the master clock. Furthermore, any internal erroneous latch values are purged within two master clock cycles. A cosmic ray strike on one of the internal nodes in any of the final majority gates can produce a SET on a clock line. These SETs do not affect the operation of the temporal sampling latches, as is explained below in more detail.

Circuit Operation

The operation of the sequential circuit 100 (FIG. 6) will now be described with reference to the clocking scheme shown in FIG. 8. For simplicity, all events are referenced relative to clock edges without regard to setup and hold times. When it is stated that a signal arrives somewhere before a clock edge, the reader is assumed to understand that the signal really arrives a setup time earlier than the clock edge. When it is stated that a signal appears at an output after a clock edge, the reader is assumed to understand that the signal appears after a time equal to the clock-to-output time.

The computational cycle begins at the rising edge of release clock CLKD, at time T1 in FIG. 8. At this time the sample release latches 128, 130, and 132 of the vote timing system 118 pass their input data to the majority system 120. The majority system 120 outputs the majority value from among the three latches. When release clock CLKD subsequently goes low (time T2), the release latches 128–132 enter a hold state and the original data remains asserted on the output for the remainder of the computational cycle.

The output of the majority system 120 is processed by intervening combinatorial logic 104 before it appears at the input to the next temporally redundant latch 106, as shown in FIG. 6. The data arrives at the input to the latch 106 sometime before the falling edge of sampling CLKA, at say time T3. At the falling edge of sampling clock CLKA (time T4), the data is stored in the first sampling system 112 formed by latches 122(A) and 124(A).

Concurrent with the falling edge of clock CLKA (time T4), the second sampling clock CLKB goes high to sample the input. When sampling clock CLKB goes back low (time T5), the data at the input of the latch is stored in the second sampling system 114 formed by latches 122(B) and 124(B). In the same way, the third sampling clock CLKC toggles high and low to sample and hold the input data at time T6 in the third sampling system 116 formed by latches 122(C) and 124(C).

At time T6 after the three sampling clock signals, another computational cycle begins. The input data to each temporal sampling system 112–116 has been asserted on the corresponding three inputs to the latches 128–132 of the vote timing system 118. When this next computational cycle begins at time T6, the release clock CLKD again goes high and the data is passed to the majority system 120 and a majority value is passed to the output of the latch 106.

Figure 11:
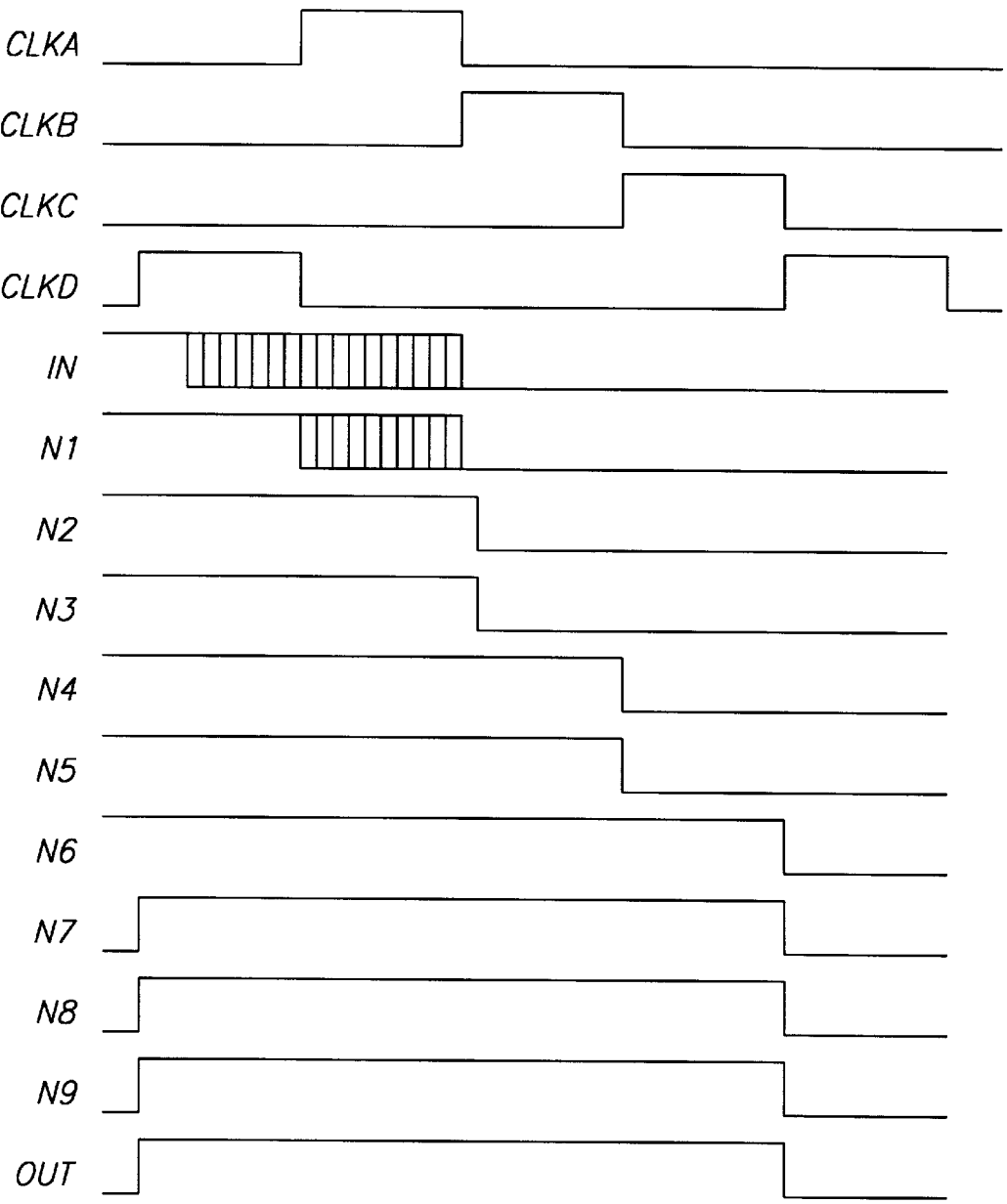
FIG. 11 is a timing diagram illustrating the operation of the temporally redundant latch in ne computational cycle.

FIG. 11 illustrates the voltage values on each node N1–N9 in the temporally redundant latch for a complete computational cycle. It shows how each node voltage is correlated to the clock signals for a temporal sampling latch whose input is high at the start of a computational cycle and goes low before the falling edge of CLKA.

Upset Immunity

The temporally redundant latches 102, 106 eliminate upsets in the sequential circuit 100. As noted above, upsets are avoided as a result of the spatial parallelism provided by the three D flip-flop sampling branches and the temporal parallelism provided by the multiple clock signals and the sampling and release architecture of the design.

Upset immunity is easiest described in terms of four distinct upset mechanisms: (1) static latch SEU, (2) data SET, (3) sampling clocks SET, and (4) release clock SET. The static latch SEU is the upset mechanism of primary concern in present day spaceborne microelectronics systems fabricated in 0.8 micron to 0.7 micron feature sizes. The other three upset mechanisms will be of concern in future systems fabricated in 0.35 micron and smaller feature sizes.

Case 1: Static Latch SEU

Static latch SEU occurs when a cosmic ray flips the data state of a latch whose clock is low and is in a blocking state (i.e., hold mode). Any such single upset in any of the nine latches in FIG. 7 will only affect one of the three parallel data paths through the circuit. When data release occurs, one of the three nodes N7, N8, or N9 from the vote timing system 118 will be in error while the other two will be correct. The majority gate 120 correctly selects the data correctly asserted on the two latches to ensure that the correct data value is asserted on the output node. Such a data flip can occur at any time within the computational cycle and not affect the output value.

Case 2: Data SET

Data SET occurs when a cosmic ray strikes a node in the combinatorial logic 104 preceding the temporally redundant latch 106 and the resulting transient propagates to the input of the latch 106 as a normal signal. The transient is latched into only one of the three parallel sampling systems 112, 114, and 116 if it arrives on a falling edge of one of the three sampling clock signals CLKA, CLKB, or CLKC. As a result, only one of the three parallel data paths is corrupted, while the other two remain correct. When data release occurs, the majority gate 120 again ensures that the correct data appears at the output node.

Case 3: Sampling Clocks SET

Cosmic ray strikes on nodes in the clock generation circuitry or in the clock distribution tree will produce SETs on the clock signal lines that can cause the latches to toggle data at unintended times. The three sampling clocks CLKA, CLKB, and CLKC are used symmetrically and can be discussed together. Remember that the controlled latch pairs 122 and 124 form a falling edge triggered D flip-flop. At falling clock edges, the D flip-flops store whatever data happens to be present at their inputs. If a clock is low, an SET will result in a rising edge followed by a falling edge. If a clock is high, an SET will produce a falling edge followed by a rising edge. In either case a data store occurs.

There are two time intervals in the computational cycle that may be affected by a sampling clock SET. The first interval starts at the rising edge of the release clock signal CLKD (beginning of a computational cycle) and ends when the released data arrives at the input to a subsequent temporally redundant latch 106. The second interval starts at this data arrival time and ends when the release clock signal CLKD again transitions high ((beginning of the next computational cycle).

If the SET induced falling edge on any of the sampling clocks CLKA, CLKB, or CLKC occurs in the first of these intervals, old data is stored in one of the three parallel sampling circuits 112–116. The true (intended) falling edge occurs later and the correct data will be sampled. The only exception is for CLKA, which may experience an SET that overlaps the true falling edge. This shifts the falling edge to an earlier time by an amount less than or equal to the SET pulse width. If this shift causes a setup time violation of the D flip-flop 112, old (incorrect) data may be stored in the first sampling circuit 112. As in the above cases, however, this results in only one of the three parallel paths being corrupted and the majority gate 120 once again produces correct data values at the output.

If the SET induced falling edge occurs in the second interval (i.e., from data arrival to clock CLKD), the only effect is to store the correct data. This SET may occur before the actual clock edge (in which case the correct sampling is performed early) or it may occur after the actual clock edge (in which case correct data is re-sampled). The SET may overlap the true clock edge in which case a single correct sampling is performed slightly early.

Case 4: Release Clock SET

The effects of an SET on the release clock CLKD are somewhat different than those on the sampling clocks CKKA, CLKB, and CLKC. Again, consider two distinct time intervals in the computational cycle: a first interval when CLKD is high and a second interval when CLKD is low. A negative transient when CLKD is high causes each of the sample release latches 128–132 to momentarily hold what was being sampled and then, when the clock restores, continue to sample what was being sampled in the first place. This event therefore has no effect on the operation of the circuit.

A positive SET when CLKD is low causes each of the sample release latches 128–132 to first sample its input (become transparent) and pass the value to the majority gate and then store (hold) this data value for the majority gate when the transient disappears. The effect of this positive transient depends on the current state of the sampling clocks CLKA, CLKB, and CLKC. If the positive SET occurs before the falling edge of sampling clock CLKA in the computational cycle, nodes N2, N4, and N6 from sampling circuits 112–116 still have their original values and the majority gate output will not change. If the positive SET occurs between the falling edge of sampling clock CLKA and the falling edge of sampling clock CLKB, node N2 may have changed but nodes N4 and N6 still have their original values and the majority gate will produce the correct output. Finally, if the positive SET occurs between the falling edge of sampling clock CLKB and the falling edge of sampling clock CLKC, both nodes N2 and N4 may have changed (to the next cycle values) and only node N6 will have its original value. In this case the majority gate output may change. However, this is simply a premature change to the next sample release value that would have eventually occurred anyway when CLKD was scheduled to rise. This premature data change could then get latched into the third sampling circuit 116 of a downstream temporally redundant latch if it arrives before the falling edge of sampling clock CLKC.

If the SET on the release clock CLKD is local to a single sampling latch, the majority gate of the downstream temporal sampling latch will suppress the erroneous value (just as it suppresses the Case (1) and Case (2) events discussed above) and the premature data release is confined to the single affected latch. If this transient is common to a group of sampling latches, all latches in the group will release prematurely. If the transient is global to the chip, such as would happen if the transient occurred in the clock generator, then all latches on the chip will prematurely release their data. In each case, nodes are simply assuming correct data values one quarter of a computational cycle early. All data values achieve correct synchronization at the start of the next computational cycle.

A benefit of the circuitry described above is that, for each of the four upset mechanisms, any erroneous data stored in any of the sampling latches is flushed within a single computational cycle. Any premature data releases get back in phase within one quarter of a computational cycle. Thus the latency of these erroneous values never exceeds one computational cycle.

For complete error elimination, the width of the SET is less than the width of any of the four clock pulses CLKA, CLKB, CLKC, and CLKD that control the latch circuitry. If the SET pulse width exceeds any of the clock pulse widths, the temporally redundant latch exhibits a non-zero error rate. For typical 100 ps to 200 ps SET pulse widths, the master clock frequency is limited to 2.50 GHz and limits the on-chip computational speed to 1.25 GHz.

Operating Modes

According to another aspect of this invention, the temporally redundant latch and the sequential circuitry in general can be operated in two different operating modes: a safe mode and a fast mode. In the safe mode, the circuit operates with upset immunity, but at a reduced clock frequency equal to one-half the master clock frequency to enable the temporal redundancy. In the fast mode, the circuit operates at the master clock frequency, but without upset immunity.

Figure 12:
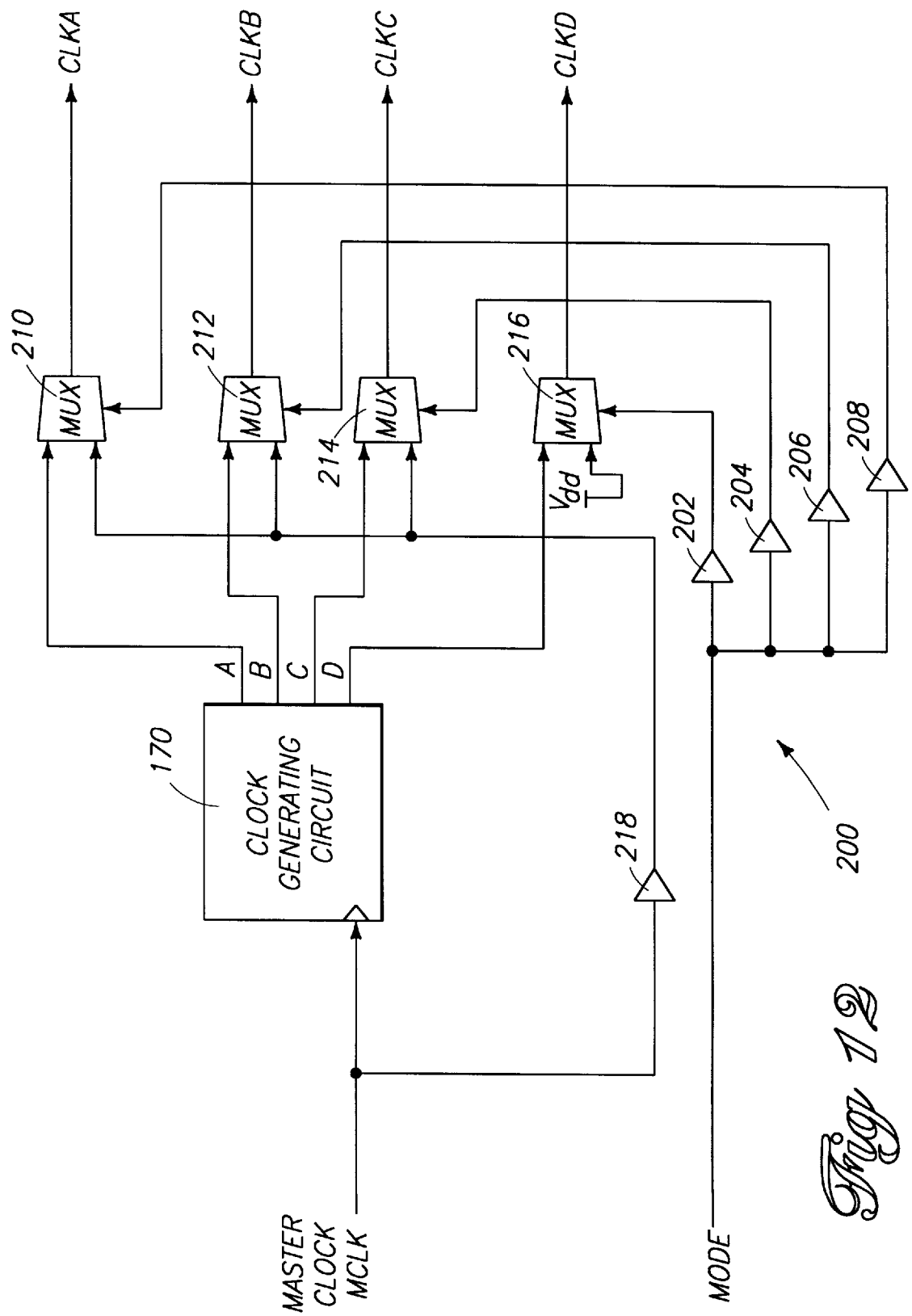
FIG. 12 is a block diagram of a mode selection circuit coupled to the clock generating circuit to enable alternatively a fast mode in which the circuit operates at the master co frequency and a safe mode in which the circuit operates at less than the master clock frequency to ensure upset immunity.

FIG. 12 shows an exemplary implementation of mode selection circuitry 200 used to select the mode of operation.

The circuitry 200 is coupled to the clock generating circuit 170 (FIG. 10). The mode selection circuitry 200 receives a MODE signal as an input and splits the MODE signal into four independent paths using buffers 202, 204, 206, and 208, which are part of the MODE input pad driver cell. The mode selection circuitry 200 also has four multiplexors 210, 212, 214, and 216 coupled to receive signals from the buffers 202–208, respectively.

The master clock signal (MCLK) feeds the clock generator circuit 170 and the multiplexors 210–216 via a buffer 218 that is included in the clock input pad driver. The resulting parallel paths for MODE and MCLK prevent a single node strike from creating multiple clock transients when the chip is operated in the safe mode using the clocking scheme of FIG. 8.

The MODE signal specifies which input of each of the four multiplexers 210–216 will be selected for the four clocks CLKA, CLKB, CLKC, and CLKD. For one value of MODE, the circuitry 200 operates in the safe mode, whereby the multiplexers 210–216 select the clock signals generated by clock generating circuit 170. In this safe mode, the chip is immune to SEUs due to the temporal redundancy. However, the redundancy comes at the expense of processing speed, with one computational cycle in safe mode being performed every two master clock cycles.

For the other value of mode, the circuitry 200 operates in the fast mode. The second input of each multiplexer is selected. In this case, the release clock CLKD is held high so that the sample release stage of each temporal sampling latch is always transparent and the sampling clocks CLKA, CLKB, and CLKC are each driven by the master clock signal. In this mode, the chip operates at the master clock frequency and the only SEU immunity provided by the temporal sampling latch is an immunity to static latch SEU since there are three D flip-flops operating in parallel.

The fast mode of operation can be used to speed up computations in the field by a factor of two when immunity to SETs is not a concern. The fast mode can also be used for earth based SEU testing. In these tests, an IC is placed in a beam of high energy heavy ions produced by an accelerator and error rates are measured. By operating the chip in fast mode, error rates due to SETs alone can be measured as a function of LET and master clock frequency since static latch SEUs are still suppressed. Such testing can provide important data to characterize fabrication technologies as a function of feature size.

Size Tradeoff

The temporally redundant latch occupies more area on the IC than a conventional D-Flip-Flop. A conventional D flip-flop can be constructed from two level sensitive latches while the temporally redundant latch is constructed using nine level sensitive latches plus one majority gate. Since a three input majority gate layout (12 transistors) is roughly the same size as a level sensitive latch (10 transistors), one might expect the temporally redundant latch to occupy about five times as much IC area as a conventional D flip-flop. For any given ASIC design, however, the total chip area does not grow by a factor of five. There are several reasons for this result.

One reason is that only the D flip-flops in the design must grow, while all of the combinatorial logic remains unchanged. Another reason is that the latches being replaced may not be conventional and hence may include more than one latch themselves. A third reason is that in some ASIC designs, total SEU immunity may only be necessary in certain blocks of sequential logic. In this case, only the D flip-flops of the critical blocks are replaced by temporally redundant latches.

Multiple Bit Heavy Ion Strikes

Multiple bit upsets (MBUs) can also occur in circuits under certain conditions, although such strikes have a much lower probability of occurrence. MBUs are considered in spaceborne microelectronics design to ensure that the associated second order cross sections are small enough for the particular application. Three types of such upsets are possible, with the first two caused by a single charged particle and the third caused by two separate charged particles.

MBU Type 1

The first type of MBU is due to a cosmic ray traveling through the IC at a shallow angle, nearly parallel the surface of the die, and simultaneously striking two sensitive junctions. It is an important mechanism for upsetting multiple bits in SRAM devices and for upsetting certain specialized latch designs (such as the DICE latch) that can only change their data state if two critical nodes are simultaneously driven. The probability of this occurring is largely geometrical with the cross section being proportional to the sensitive areas of the Junctions that is normal to the incident cosmic ray and to the solid angle subtended between the these sensitive areas. This geometrical probability decreases as the square of the feature size as devices become smaller. The ratio between MBUs and SEUs, however, remains constant as devices become smaller since the SEU cross section also decreases as the square of the feature size.

Multiple node hits can occur in the temporally redundant latch itself or on the clock tree buffers. A multiple upset in two of the three parallel latch paths in the sampling latch will produce an error at the latch output. Similarly, multiple SETs on two of the three sampling clocks (CLKA, CLKB, and CLKC) while release clock CLKD is high could cause latch feed through for certain fast circuits, such as shift registers.

The probability of this type of MBU can be minimized in a circuit design by taking care in the physical layout so as to separate critical node junctions by large distances and to align such junctions so that the area of each, as viewed from the other, is minimized. For minimum sized junctions, properly aligned and separated (placed in adjacent rows) in a standard cell design, the ratio of MBUs to SEUs can usually be kept smaller than $1 \times 10^{-4}$.

In typical 0.8 micron technologies, standard cell latches have exhibited LET upset thresholds on the order of 20 MeV-cm$^2$/mg and SEU rates on the order of $1 \times 10^{-8}$ errors/bit-day. This means that MBUs, for 0.8 micron designs, exhibit rates of $1 \times 10^{-12}$ errors/bit-day. For a worst case scenario as feature sizes decrease to 0.15 microns, the MBU geometrical cross section decreases by a factor of 28 (as the square of the feature size), the critical LET can become as small as 1 MeV-cm$^2$/mg, and the integral cosmic ray fluency above the threshold LET increases by a factor of 1000 (from 0.001 to 1.0 ions/m$^2$/sr/s for a geosynchronous orbit). The result of this is an increase of the MBU rate from $1 \times 10^{-12}$ errors/bit-day to $4 \times 10^{-11}$ errors/bit-day. For low earth circular orbits with inclinations less that 40 degrees, the fluency is much less at all LETs because of the geomagnetic cutoff. The MBU rate for 0.15 micron technologies remains under $1 \times 10^{-12}$ errors/bit-day for these orbits which may be acceptable for most applications.

If the MBU rate is too high for any particular circuit application, one solution is to implement the temporally redundant latch using DICE latches, each of which can only be upset if two critical nodes are simultaneously struck by a heavy ion. The temporal flip-flop will then upset only if four critical nodes are simultaneously struck, which can be easily avoided by placing the DICE latches within the layout so that no four critical nodes lie on any straight line. The DICE latches can also be designed to each use two independent clock (and also set/reset) signals of which both must transition to latch in data. This would mean that four clock buffers in the clock tree must be simultaneously struck by a cosmic ray for the temporal flip-flop to experience a double clock SET. Again, it is easy to avoid lining up four critical clock nodes in the layout. In this way, the temporal sampling scheme can be made totally immune to SEUs and MBUs.

While the preceding discussion has focused on multiple strikes within the temporally redundant latch itself, multiple strikes can also occur in the combinatorial logic that generates the input signal to the latch. Such a multiple strike can produce two distinct transients that arrive at the latch input at different times. The time interval separating these transients depends on where in the combinatorial logic the two strikes occurred. An error may be stored if the first transient coincides with the falling edge of sampling clock CLKA and the second coincides with the falling edge of sampling clock CLKB. Alternatively, the first and second transients could coincide with the falling edges of sampling clocks CLKB and CLKC, respectively. If the widths of CLKB and CLKC are less than the widths of CLKA and CLKD, an error can also be stored on the falling edges of CLKA and CLKC. The probability of this happening is very low.

If the error rate of MBUs of this type are determined to be too large, another alternative is to totally eliminate MBUs in the temporally redundant latch by decreasing the master clock frequency until the width of the each sampling and release clock signal is larger than the longest propagation time through any group of combinatorial logic. It will then be impossible for two correlated transients to fall on two separate falling clock edges.

MBU Type 2

In the second type of MBU, the heavy ion strikes the IC at an angle nearly normal to the surface of the die. In this case, multiple nodes can collect charge and experience voltage transients if sufficient charge is deposited and if the collecting junctions are sufficiently near each other in the layout. Since the strike is near vertical, at least one of junctions must collect its charge via the diffusion component of the charge collection process. This falls off rapidly with distance from the strike and therefore this MBU mechanism is really of concern only in extremely dense layouts, such as SRAMs or DRAMs (dynamic random access memories). In ASIC standard cell designs, critical node separations can easily be maintained at safe values.

MBU Type 3

In the third type of MBU, two distinct heavy ions strike two critical nodes nearly simultaneously. The window of opportunity for this type of MBU is simply the latency of the initial error. This type of MBU is really of importance only in devices such as DRAMs where the error latency can be long if the refresh rate is low. In the sequential circuit described above, the latency of any given error will never exceed one clock cycle. This type of MBU will, therefore, never have any significant probability of occurring. For example, even at a relatively slow computational clock frequency of 20 MHz (master clock frequency of 40 MHz), the error latency never exceeds 50 nanoseconds ($5 \times 10^{-13}$ days). For even a large SEU rate of $10^{-5}$ errors/bit-day, this latency will result in an MBU rate of only $5 \times 10^{-18}$ errors/bit-day, which is totally insignificant (such a multiple bit error would be likely only every $2 \times 10^{17}$ years).

Exemplary Environment

The temporally redundant latch has beneficial uses in microelectronics systems that process digital data and are required to preserve data integrity in cosmic ray environments. Such processing operations might include computing output data values from input data values. This would be typical of the tasks performed by satellite, spacecraft, and manned space station flight control systems and life support systems. It would also apply to remote processing of sensor data prior to telemetry to earth. Thus, both general digital processor systems and specialized digital signal processor systems can benefit by using the temporal latch to eliminate data upset.

Other digital processing functions might only queue and route data from one processing unit to another. These functions, unless hardened against upset, can corrupt digital data just as easily as general processing units. These functions would be typical of the tasks performed within data communications satellites. The temporal latch represents an enabling technology that permits these satellite, space vehicle, and space station digital electronic systems to operate free of upsets in cosmic ray environments.

Data integrity will become increasingly important in aircraft control systems as computer flight control becomes prevalent since significant heavy ion environments exist in ICs above altitudes of 30,000 feet. These heavy ions are recoil reaction byproducts, within the silicon IC itself, from interactions with the high energy proton and neutron components of cosmic ray showers formed when cosmic rays undergo nuclear reactions in the atmosphere. Aircraft flight control electronics are life critical systems that require high levels of data integrity and will benefit by using the temporal latch to eliminate data upsets.

Figure 13:
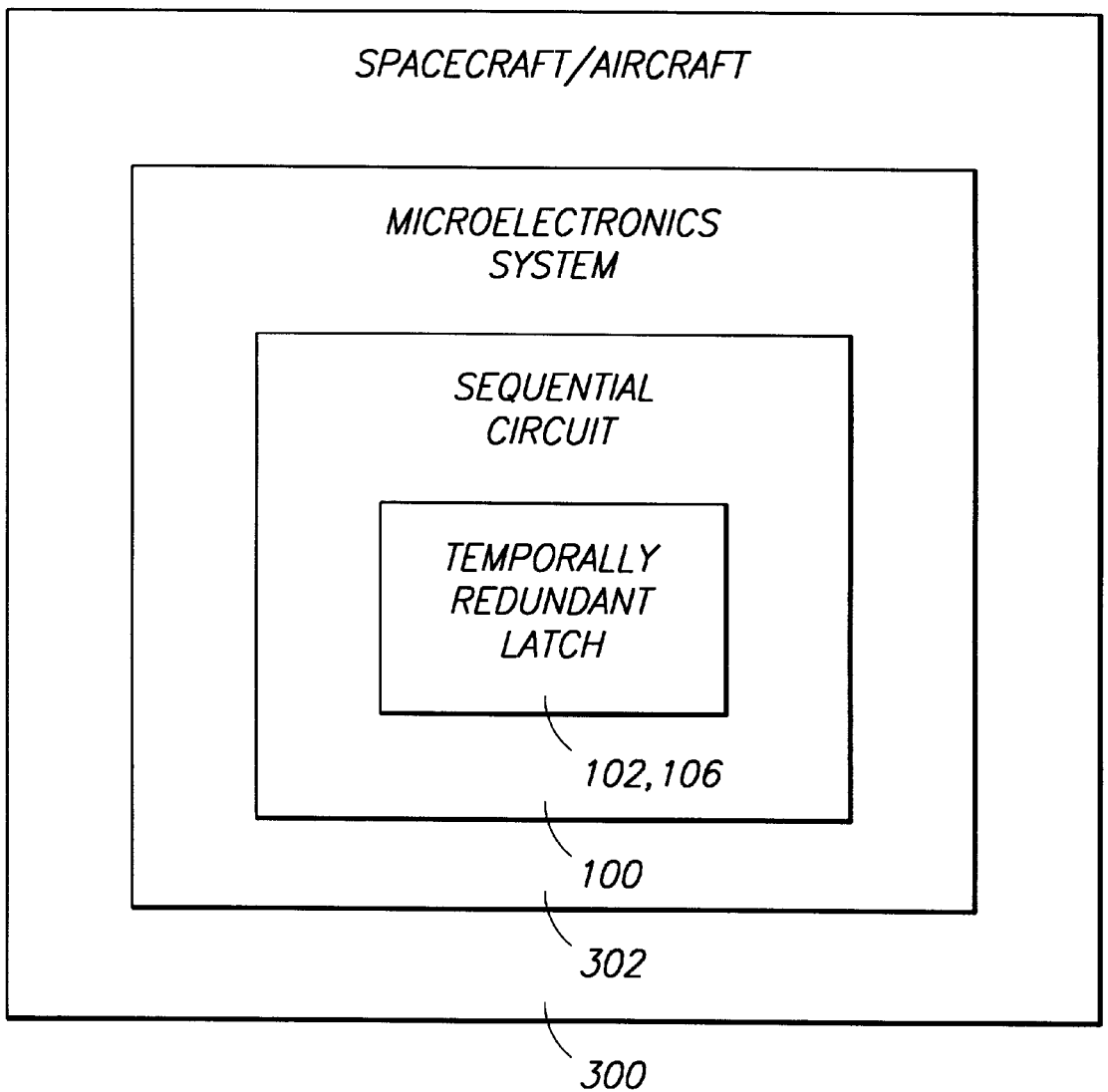
FIG. 13 is a block diagram of an aircraft/spacecraft having a microelectronics system with the sequential circuit of FIG. 6.

FIG. 13 shows an exemplary aircraft/spacecraft 300 having a microelectronics system 302. The microelectronics system 302 can be employed in the flight control systems, life control systems, digital signal processors, general processing units, and so forth. The microelectronics system 302 contains the sequential circuit 100, as described above with respect to FIG. 6, which includes the temporally redundant latches 102, 106.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

We claim:

1. An integrated circuit device comprising:
   multiple sampling systems to sample input data at different times, wherein periods between the different times exceed a duration of a pulse width of a single event upset;
   a vote timing system coupled to collect samples from the sampling systems at another time; and
   a majority system to select a majority of the samples gathered by the vote timing system.

2. An integrated circuit device as recited in claim 1, wherein each of the sampling systems comprises a latch.

3. An integrated circuit device as recited in claim 1, wherein each of the sampling systems comprises a dual interlocked storage cell that cannot be upset with a single node strike.

4. An integrated circuit device as recited in claim 1, wherein each of the sampling systems comprises a D flip-flop.

5. An integrated circuit device as recited in claim 1, wherein the sampling systems comprise:
- a first sampling system that samples the input data at a first time;
- a second sampling system that samples the input data at a second time after the first time; and
- a third sampling system that samples the input data at a third time after the first and second times.

6. An integrated circuit device as recited in claim 5, further comprising clock generating circuitry to derive three clock signals from a master clock signal, the three clock signals being used to define the first, second, and third times.

7. An integrated circuit device as recited in claim 5, wherein the vote timing system collects the samples at a fourth time different from the first, second, and third times.

8. An integrated circuit device as recited in claim 1, further comprising mode selection circuitry operatively coupled to the multiple sampling systems to drive the multiple sampling systems alternately between (1) a safe mode in which periods between the different times exceed a duration of a pulse width of a single event upset and (2) a fast mode in which the periods between the different times do not exceed a duration of a pulse width of a single event upset.

9. A sequential circuit comprising:
- combinatorial logic; and
- an integrated circuit device as recited in claim 1 coupled to the combinatorial logic.

10. An integrated circuit device as recited in claim 1 embodied in a spaceborne microelectronics system.

11. An integrated circuit device as recited in claim 1 embodied in a satellite.

12. An integrated circuit device as recited in claim 1 embodied in a spacecraft.

13. An integrated circuit device as recited in claim 1 embodied in an aircraft control system.

14. An integrated circuit device comprising:
- a clock generating circuit to generate first, second, third, and fourth clock signals from a master clock signal wherein periods between the clock signals exceed a duration of a pulse width of a single event upset;
- a first sampling circuit triggered by the first clock signal to sample input data at a first time;
- a second sampling circuit triggered by the second clock signal to sample the input data at a second time;
- a third sampling circuit triggered by the third clock signal to sample the input data at a third time; and
- a sample release circuit coupled to the first, second, and third sampling circuits and triggered by the fourth clock signal to output at a fourth time a majority of the samples collected by the first, second, and third sampling circuits.

15. An integrated circuit device as recited in claim 14, wherein the master clock signal has a first frequency and the first, second, third, and fourth clock signals operate at a second frequency that is one-half the first frequency.

16. An integrated circuit device as recited in claim 14, wherein the first, second, third, and fourth clock signals are time shifted from one another.

17. An integrated circuit device as recited in claim 14, wherein each of the first, second, third, and fourth clock have a width greater than 200 ps.

18. An integrated circuit device as recited in claim 14, wherein the clock generating circuit comprises a latch to receive the master clock signal and a decoder to produce the first, second, third, and fourth clock signals from the master clock signal.

19. An integrated circuit device as recited in claim 14, wherein each of the sampling circuits comprises a latch.

20. An integrated circuit device as recited in claim 14, wherein each of the sampling circuits comprises a dual interlocked storage cell that cannot be upset with a single node strike.

21. An integrated circuit device as recited in claim 14, wherein each of the sampling circuits comprises a D flip-flop.

22. An integrated circuit device as recited in claim 14, wherein the sample release circuit comprises:
- a vote timing circuitry coupled to receive the samples taken by the first, second, and third sampling circuits at the fourth time; and
- a majority system to select a majority of the samples received by the vote timing circuitry.

23. An integrated circuit device as recited in claim 14, further comprising a mode selection circuit coupled to the clock generating circuit to enable a fast mode of operation in which the first, second, and third sampling circuits and the sample release circuit operate at a frequency of the master clock signal without upset immunity.

24. A sequential circuit comprising:
- combinatorial logic; and
- an integrated circuit device as recited in claim 15 coupled to the combinatorial logic.

25. An integrated circuit device as recited in claim 14 embodied in a spaceborne microelectronics system.

26. An integrated circuit device as recited in claim 14 embodied in a satellite.

27. An integrated circuit device as recited in claim 14 embodied in a spacecraft.

28. An integrated circuit device as recited in claim 14 embodied in an aircraft control system.

29. An integrated circuit device, comprising:
- a clock generating circuit having multiple generators, each of which produces a set of first, second, third, and fourth clock signals from a master clock signal and a majority system to select a majority from the sets of clock signals produced by the multiple generators to produce a majority first clock signal, a majority second clock signal, a majority third clock signal, and a majority fourth clock signal;
- a first sampling circuit triggered by the majority first clock signal to sample input data at a first time;
- a second sampling circuit triggered by the majority second clock signal to sample the input data at a second time;
- a third sampling circuit triggered by the majority third clock signal to sample the input data at a third time; and
- a sample release circuit coupled to the first, second, and third sampling circuits and triggered by the majority fourth clock signal to output at a fourth time a majority of the samples collected by the first, second, and third sampling circuits.

30. A temporally redundant latch comprising:
- means for receiving data from circuitry; and
- means for redundantly sampling the data at multiple time-shifted periods, wherein each of the periods exceeds a duration of a pulse width of a single event upset.

31. A temporally redundant latch as recited in claim 30, further comprising means for selecting a majority of samples taken from the data.

32. A temporally redundant latch as recited in claim 30, further comprising means for generating multiple clock signals to effectuate the redundant sampling.

33. A temporally redundant latch as recited in claim 30, further comprising mode selection means for driving the redundantly sampling means alternately between (1) a safe mode of operation in which the data is sampled at periods which exceed a duration of a pulse width of a single event upset and (2) a fast mode of operation in which the data is sampled at periods which do not exceed the duration of the pulse width of the single event upset.

34. A method for controlling upsets in an integrated circuit device, comprising:

sampling data at multiple different times to produce multiple time-spaced samples that are spaced temporally longer than a pulse width of a single event upset;

collecting the time-spaced samples at another time; and selecting a majority from the time-spaced samples.

35. A method as recited in claim 34, wherein the different times and said another time are separate from one another.

36. A method as recited in claim 34, further comprising the step of alternatively switching between a safe mode of operation in which data is sampled at multiple different times to produce multiple time-spaced samples that are spaced temporally longer than a pulse width of a single event upset and a fast mode of operation in which the data is sampled at times in which the time-spaced samples are temporally spaced so as not to exceed the pulse width of the single event upset.

37. A method for controlling upsets in an integrated circuit device, comprising:

generating first, second, third, and fourth clock signals such that time periods between the clock signals exceed a pulse width of a single event upset;

sampling data at a first time determined by the first clock signal to produce a first data sample;

sampling the data according at a second time determined by the second clock signal to produce a second data sample;

sampling the data according at a third time determined by the third clock signal to produce a third data sample; and selecting a majority of the first, second, and third data samples at a fourth time determined by the fourth clock signal.

38. A method for controlling upsets in an integrated circuit device comprising receiving data from circuitry and redundantly sampling the data at time-shifted sampling periods, wherein each of the periods exceeds a duration of a pulse width of a single event upset.

39. A method as recited in claim 38 further comprising the step of selecting a majority from the samples taken from the data.

\* \* \* \* \*